US011968805B2

(12) United States Patent
Skoglund et al.

(10) Patent No.: US 11,968,805 B2
(45) Date of Patent: Apr. 23, 2024

(54) HEATSINK HAVING AIR PARTITIONING BAFFLE

(71) Applicant: Telefonaktiebolaget LM Ericsson (publ), Stockholm (SE)

(72) Inventors: Stefan Skoglund, Stockholm (SE); Adrianus Van Gaal, Ottawa (CA); Elisabet Aldurén, Taby (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 390 days.

(21) Appl. No.: 17/288,760

(22) PCT Filed: Nov. 2, 2018

(86) PCT No.: PCT/IB2018/058636
§ 371 (c)(1),
(2) Date: Apr. 26, 2021

(87) PCT Pub. No.: WO2020/089680
PCT Pub. Date: May 7, 2020

(65) Prior Publication Data
US 2021/0400837 A1 Dec. 23, 2021

(51) Int. Cl.
F28F 7/00 (2006.01)
H05K 7/20 (2006.01)

(52) U.S. Cl.
CPC ....... H05K 7/2039 (2013.01); H05K 7/20127 (2013.01)

(58) Field of Classification Search
CPC .................. H05K 7/2039; H05K 7/20127
USPC ..................................... 165/80.3
See application file for complete search history.

(56) References Cited

U.S. PATENT DOCUMENTS

| 5,063,476 A | * | 11/1991 | Hamadah | H01L 23/467 |
| | | | | 257/E23.099 |
| D323,813 S | | 2/1992 | Keck | |
| D328,057 S | | 7/1992 | Prager et al. | |
| D366,243 S | | 1/1996 | Kurokawa et al. | |
| D379,799 S | | 6/1997 | Widmayer et al. | |
| D388,399 S | | 12/1997 | Widmayer et al. | |
| 5,704,212 A | * | 1/1998 | Erler | F25B 21/04 |
| | | | | 361/679.48 |

(Continued)

FOREIGN PATENT DOCUMENTS

| GB | 2536051 A | 9/2016 |
| JP | 2001352025 A | 12/2001 |

(Continued)

OTHER PUBLICATIONS

Indian Examination Report dated Sep. 22, 2021 issued in corresponding Indian Patent Application No. 202147024132, consisting of 6 pages.

(Continued)

Primary Examiner — Davis D Hwu
(74) Attorney, Agent, or Firm — Weisberg I.P. Law, P.A.

(57) ABSTRACT

A heatsink with an air-partitioning baffle. In one embodiment, the heatsink comprises a plurality of fins defining a plurality of channels, an inlet channel that is at least partially defined by the plurality of fins and extends across the plurality of channels, and a baffle at least partially within the inlet channel. The baffle is configured to direct a first fluid flow, such as warm air, from a first portion of the plurality of channels and to direct a second fluid flow, such as cooling air, through at least one inlet of the inlet channel to a second portion of the plurality of channels.

15 Claims, 22 Drawing Sheets

(56) References Cited

U.S. PATENT DOCUMENTS

| | | |
|---|---|---|
| D457,492 S | 5/2002 | Kim |
| D573,945 S | 7/2008 | Park |
| 7,738,252 B2 | 6/2010 | Schuette et al. |
| D755,740 S | 5/2016 | Chen et al. |
| D793,400 S | 8/2017 | Lin et al. |
| D804,434 S | 12/2017 | Lu et al. |
| D880,436 S | 4/2020 | Schafer et al. |
| 2006/0268523 A1 | 11/2006 | Lin |
| 2013/0292105 A1 | 11/2013 | Salamon et al. |
| 2013/0312940 A1 | 11/2013 | Huang |
| 2016/0261030 A1 | 9/2016 | Kim et al. |

FOREIGN PATENT DOCUMENTS

| | | |
|---|---|---|
| JP | 2014192409 A | 10/2014 |
| WO | 2013/123913 A1 | 8/2013 |

OTHER PUBLICATIONS

International Search Report and Written Opinion dated Jun. 28, 2019 issued in PCT Application No. PCT/IB2018/058636, consisting of 13 pages.

Korean Preliminary Rejection and English Summary of the Korean Preliminary Rejection dated Nov. 29, 2022 Issued in Korean Patent Application No. 2021-7016290, consisting of 7 pages.

Korean Notice of Allowance and machine English translation of the Korean Notice of Allowance dated May 22, 2023 Issued in Korean Patent Application No. 2021-7016290, consisting of 14 pages.

Hearing Notice issued by the Intellectual Property Office of India dated Oct. 15, 2023 issued in corresponding Indian Application No. 202147024132, consisting of 2 pages.

\* cited by examiner

HEATSINK HAVING AIR PARTITIONING BAFFLE

CROSS-REFERENCE TO RELATED APPLICATION

This application is a Submission Under 35 U.S.C. § 371 for U.S. National Stage Patent Application of International Application Number: PCT/IB2018/058636, filed Nov. 2, 2018 entitled "HEATSINK HAVING AIR PARTITIONING BAFFLE," the entirety of which is incorporated herein by reference.

TECHNICAL FIELD

The present disclosure relates to cooling systems for wireless communication systems, and in particular, to a convection heatsink having an air-partitioning baffle that shunts used warm air from the heatsink and allows entry of fresh cooler air into the heatsink.

BACKGROUND

Heatsinks are commonly used to remove heat from an electrical system and prevent or reduce the occurrence of component failure, and extend component lifespan. For example, convection heatsinks, such as the convection heatsink 10 shown in FIGS. 1 and 2, remove heat from an electrical system 12 by facilitating heat transfer from the system components to one or more fins 14 or projections and heat transfer from the fins 14 to the surrounding air. A thermal gradient of an electrical system 12 cooled by such a heatsink 10 is shown in FIG. 3. As the temperature of the air surrounding the fins 14 increases, the air becomes less dense and rises. This naturally produces some airflow within and, then, out of the heatsink. Natural convection heatsinks completely, or in some part, rely on this natural airflow to remove heat from the heatsink, whereas systems including forced-air convection heatsinks also include a fan, blower, or other device to force movement of air into, within, and out of the heatsink.

Natural convection heatsinks 10 require some minimum temperature difference between the air within the heatsink and the fins 14 themselves for the air to efficiently remove heat from the fins 14. The longer air remains in the heatsink 10 (that is, the longer the air flows between the fins 14), the less the amount of heat the air can remove from the fins 14 and, therefore, the less the amount of heat the fins 14 can remove from the electrical system 12.

A certain temperature difference between the heatsink solid structure (for example, fins 14, base plate, and any other components) and the fluid (air) flowing through the heatsink 10 may be required for the heat energy to transfer from the heatsink solid structure to the fluid. Thus, currently known heatsinks 10 with long fins 14 tend to lose heat transferring capacity with increased distance.

Depending on the size of the electrical system, the heatsink 10 may need to be long or large to accommodate the amount of heat removal required. To accomplish this, current heatsinks 10 simply include longer fins 14. For example, the fins 14 are typically extruded to a desired length, width, and depth to provide the heatsink with as much wetted surface area as possible. In a vertically mounted heatsink 10 (as shown in FIGS. 1 and 2), cooling air enters the base 16 of the heatsink 10, travels through the air channels between the fins 14, and exits from the top 18 of the heatsink (as indicated by the larger arrows in FIG. 2). Some air may also enter between the fins 14 along the length of the heatsink 10. The temperature of the exiting air is significantly higher than the temperature of the air entering the heatsink 10, i.e., air entering the inlet points of the heatsink 10. As a result, the heatsink 10 is also much warmer near the outlet or exit points at the top 18, which results in electronics closer to the outlet or exit points being at a higher temperature than electronics closer to the inlet points. For example, as shown in FIG. 3, an electrical system 12 cooled by the heatsink 10 may include two heat-generating components 20A and 20B (such as radio circuit boards), with one heat-generating component 20A being at or proximate the base 16 of the heatsink 10 and a second heat-generating component 20B being at or proximate the top 18 of the heatsink 10. With the airflow (shown in FIG. 3) produced in currently known heatsinks 10 (such as that shown in FIG. 1), the second heat-generating component 20B is cooled less efficiently since the temperature of the heatsink 10 proximate the second heat-generating component 20B is greater and the cooling capacity of the air within the heatsink 10 is diminished. The higher operating temperature of the second heat-generating component 20B may result in component failure and/or shorter usable lifespan.

Further, in wireless communication systems such as a $5^{th}$ Generation (5G), New Radio (NR), Long Term Evolution (LTE) and/or other Third Generation Partnership Project (3GPP) based wireless communication standard these variations or differences in temperature of portions (i.e., heat-generating components 20A and 20B) of the heatsink 10 may disadvantageously alter at least one property of the wireless communication system. For example, beamforming characteristics of a base station, e.g., gNB, eNB, etc., may be altered due to increased temperature of at least some of the electronics in thermal communication with one or more portions of the heatsink.

SUMMARY

Some embodiments advantageously provide a device and system for convection cooling. In particular, some embodiments provide a heatsink with an air-partitioning baffle. In one embodiment, a heatsink comprises: a plurality of heat-dissipating elements defining a plurality of channels; an inlet channel at least partially defined by the plurality of heat-dissipating elements, the inlet channel extending across the plurality of channels; and a baffle at least partially within the inlet channel, the baffle directing a first fluid flow from a first portion of the plurality of channels and directing a second fluid flow to a second portion of the plurality of channels.

In one aspect of the embodiment, each of the plurality of heat-dissipating elements includes: a first segment; a second segment, the first segment and the second segment each having a same first maximum height; and a third segment between the first segment and the second segment, the third segment having a second maximum height that is different than the first maximum height.

In one aspect of the embodiment, the inlet channel is at least partially defined by the third segment of each of the plurality of heat-dissipating elements.

In one aspect of the embodiment, the plurality of heat-dissipating elements are comprised of a plurality of fins including a first outermost fin and a second outermost fin, the inlet channel having: a first inlet at least partially defined by a portion of the first segment of the first outermost fin, a portion of the second segment of the first outermost fin, the third segment of the first outermost fin, and a first portion of the baffle; and a second inlet at least partially defined by a portion of the first segment of the second outermost fin, a portion of the second segment of the second outermost fin, the third segment of the second outermost fin, and a second portion of the baffle.

In one aspect of the embodiment, the first portion of the plurality of channels includes a plurality of first channels between the first segments of the heat-dissipating elements; and the second portion of the plurality of channels includes a plurality of second channels between the second segments of the heat-dissipating elements.

In one aspect of the embodiment, the baffle directs the first fluid flow from the plurality of first channels and away from the heatsink and directs the second fluid flow into the inlet channel and then from the inlet channel into the plurality of second channels.

In one aspect of the embodiment, the inlet channel is between the plurality of first channels and the plurality of second channels.

In one aspect of the embodiment, the baffle includes: a first portion; a second portion opposite the first portion; and a scoop extending between the first portion and the second portion.

In one aspect of the embodiment, the second portion is at least substantially planar and lies in a first plane.

In one aspect of the embodiment, at least a portion of the first portion lies in a second plane that is different than the first plane.

In one aspect of the embodiment, the scoop extends at an angle from the second portion to the portion of the first portion that lies in the second plane.

In one aspect of the embodiment, the scoop includes a first surface and a second surface opposite the first surface, the inlet channel being at least partially defined by the second surface.

In one aspect of the embodiment, each of the plurality of heat-dissipating elements has a free edge, the second portion having a plurality of projections, each of the plurality of projections being in contact with a free edge of a corresponding one of the plurality of heat-dissipating elements.

In one aspect of the embodiment, the plurality of projections position the second portion a distance from the free edges of the plurality of heat-dissipating elements.

In one aspect of the embodiment, the first fluid flow includes air having a first temperature and the second fluid flow includes air having a second temperature that is less than the first temperature.

In one aspect of the embodiment, the inlet channel is a first inlet channel and the baffle is a first baffle, the convection heatsink further comprising: a second inlet channel at least partially defined by the plurality of heat-dissipating elements, the second inlet channel extending across the plurality of channels; and a second baffle at least partially within the second inlet channel.

In one aspect of the embodiment, the second baffle directs the second fluid flow from the second portion of the plurality of channels and directs a third fluid flow into a third portion of the plurality of channels.

In one embodiment, a heatsink comprises: a plurality of fins, each of the plurality of fins including: a first segment; a second segment, the first segment and the second segment having a same first maximum height; and a third segment between the first segment and the second segment, the third segment having a second maximum height that is different than the first maximum height; a plurality of first airflow channels between the first segments and a plurality of second airflow channels between the second segments; an inlet channel at least partially defined by the third segments, the inlet channel having at least one inlet and extending across the plurality of fins between the plurality of first airflow channels and the plurality of second airflow channels; and a baffle at least partially within the inlet channel, the baffle directing a first flow of warm air from the plurality of first airflow channels and away from the heatsink and directing a second flow of cooling air through the at least one inlet into the inlet channel and then to the plurality of second airflow channels.

In one aspect of the embodiment, the baffle includes: a first portion; a second portion opposite the first portion; and a scoop extending between the first portion and the second portion.

In one aspect of the embodiment, the scoop includes a first surface and a second surface opposite the first surface, the inlet channel being at least partially defined by the second surface.

BRIEF DESCRIPTION OF THE DRAWINGS

A more complete understanding of embodiments described herein, and the attendant advantages and features thereof, will be more readily understood by reference to the following detailed description when considered in conjunction with the accompanying drawings wherein.

DETAILED DESCRIPTION

Figure 1:
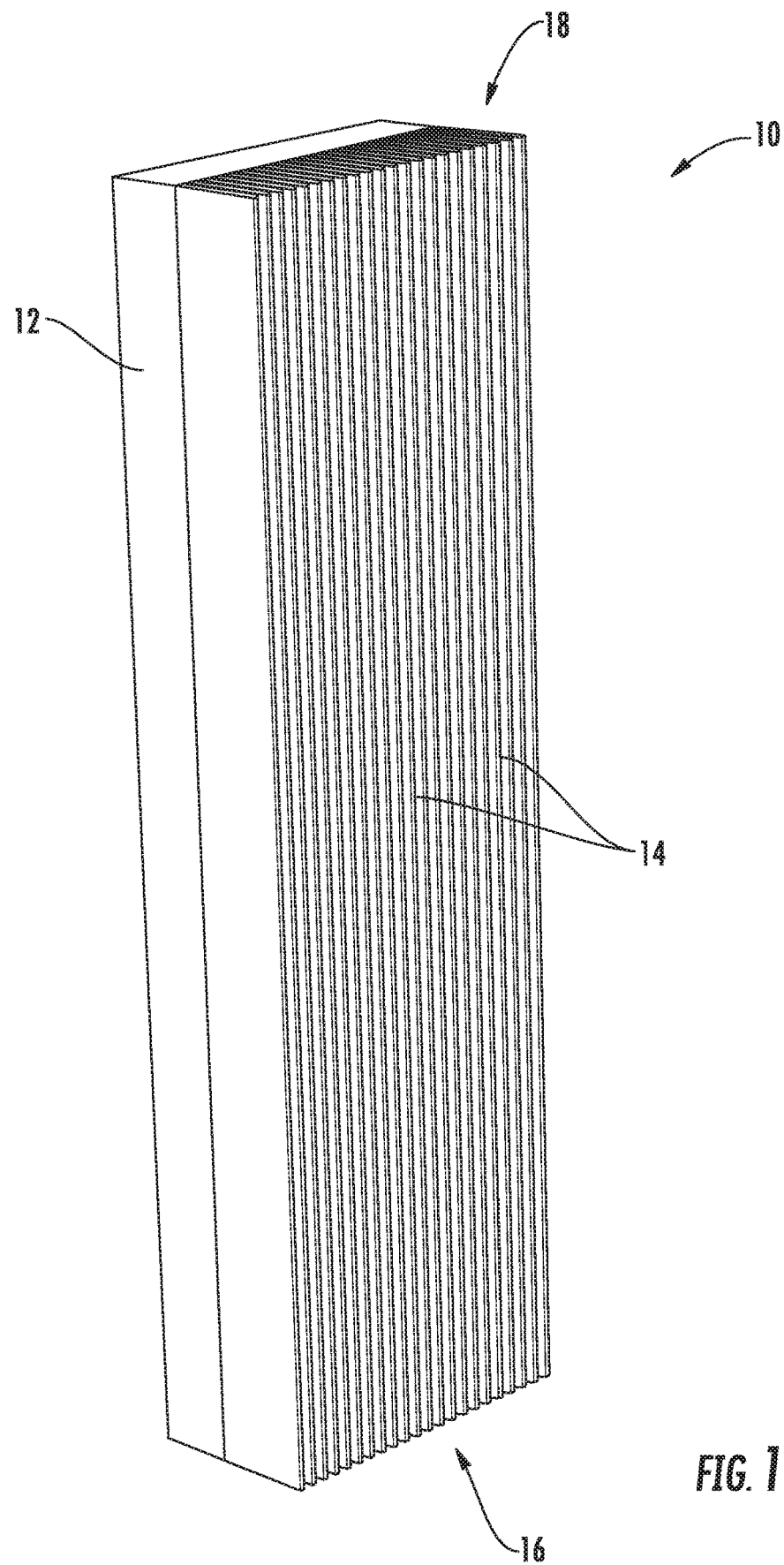
FIG. 1 shows a side perspective view of a currently known heatsink for convection cooling having a plurality of fins.
Figure 2:
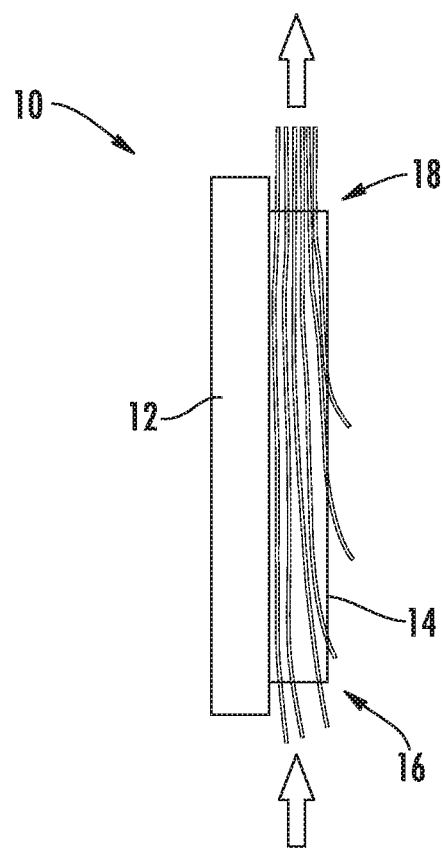
FIG. 2 shows a stylized side view of the currently known heatsink of FIG. 1 and airflow therethrough.

Before describing in detail exemplary embodiments, it is noted that the embodiments reside primarily in a device related to convection cooling in a wireless communication system. Accordingly, the system and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In some embodiments described herein, the term "coupled," "connected," and the like, may be used herein to indicate a connection, although not necessarily directly, and may include wired and/or wireless connections.

Figure 4:
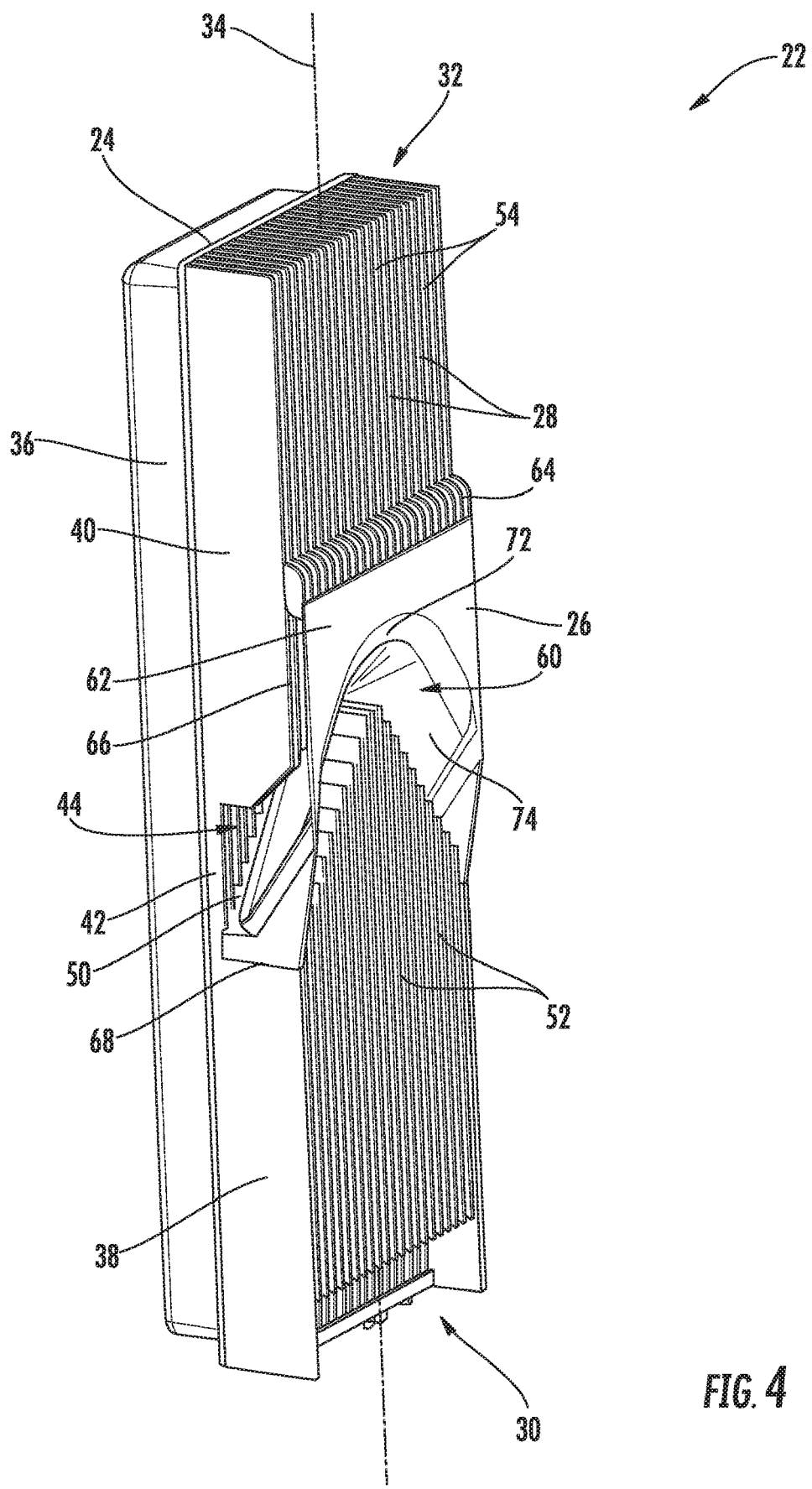
FIG. 4 shows a side perspective view of an exemplary heatsink for convection cooling having a plurality of heat-dissipating elements and an exemplary baffle in accordance with the principles of the disclosure.
Figure 5:
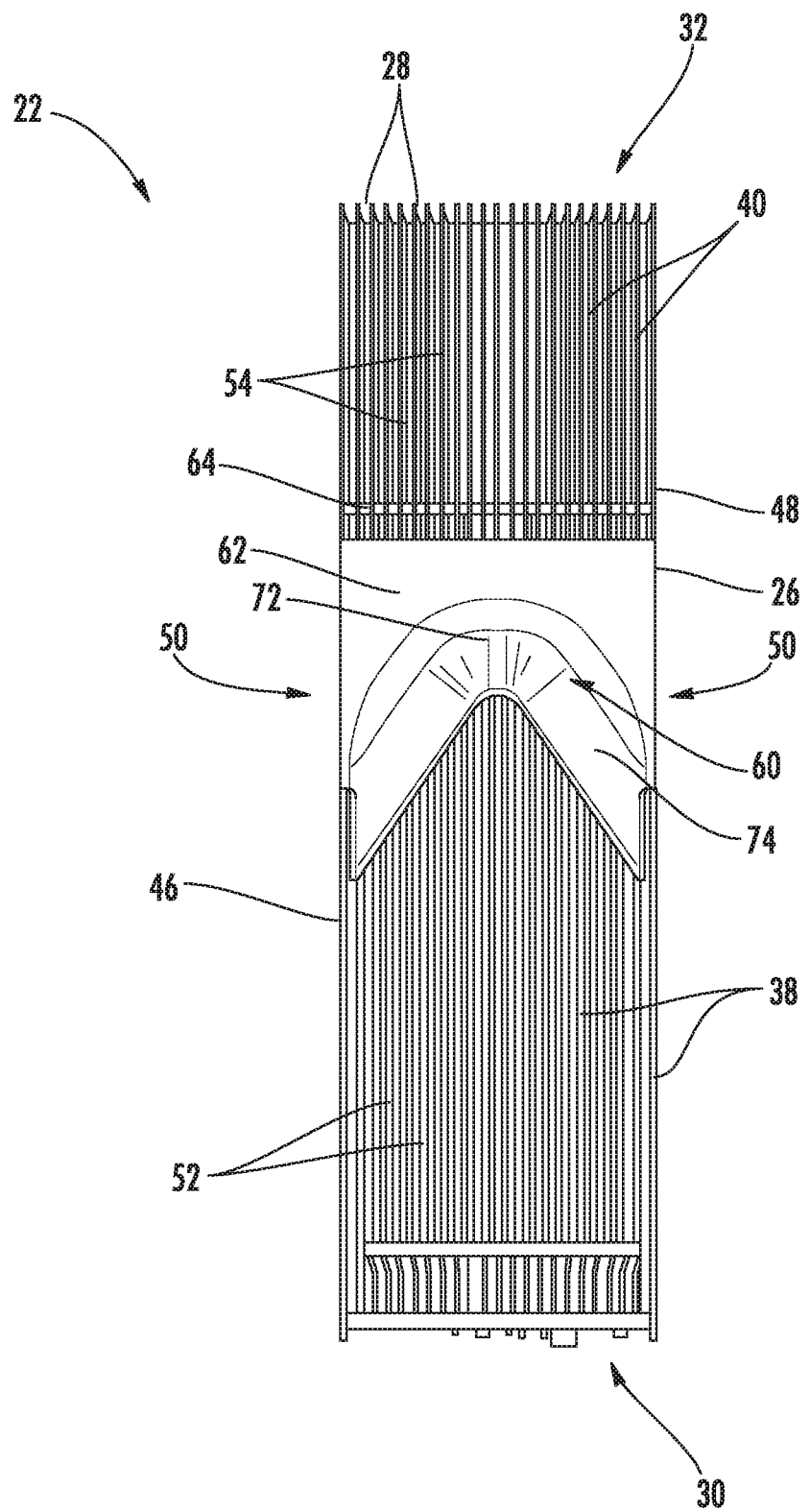
FIG. 5 shows a rear view of the heatsink of FIG. 4 in accordance with the principles of the disclosure.
Figure 6:
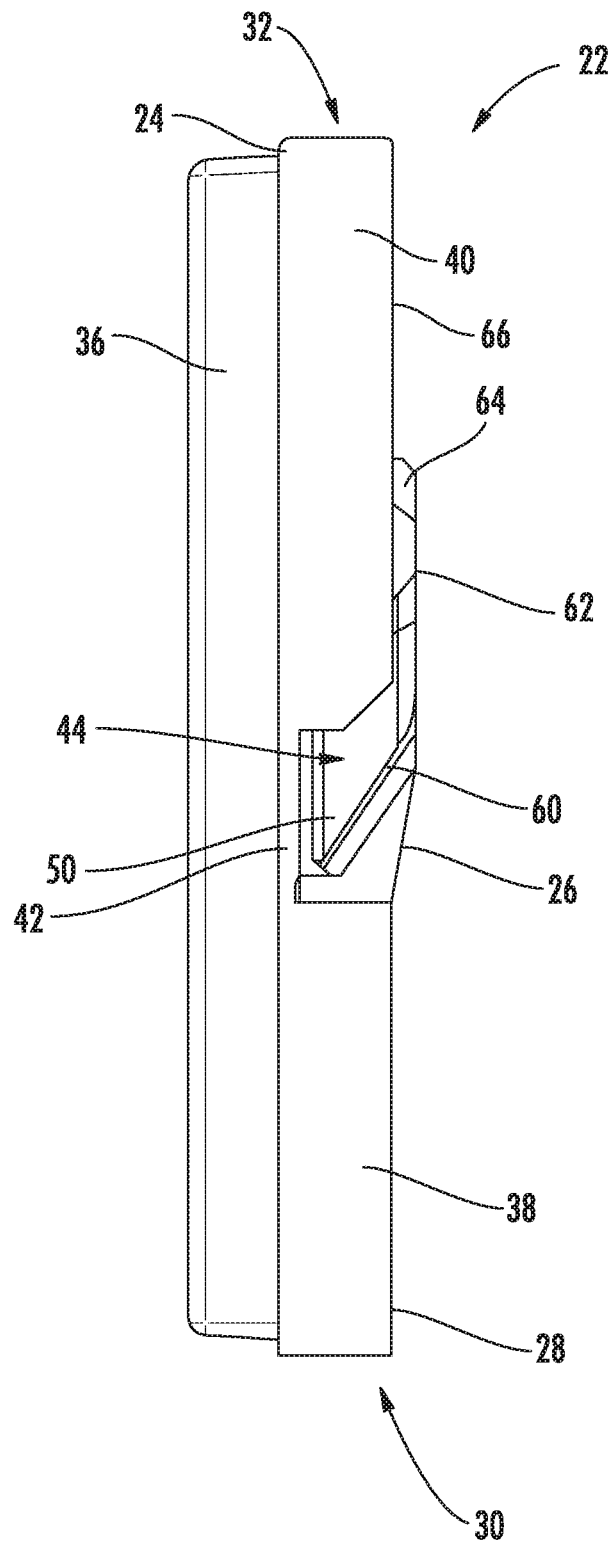
FIG. 6 shows a side view of the heatsink of FIG. 4 in accordance with the principles of the disclosure.
Figure 21:
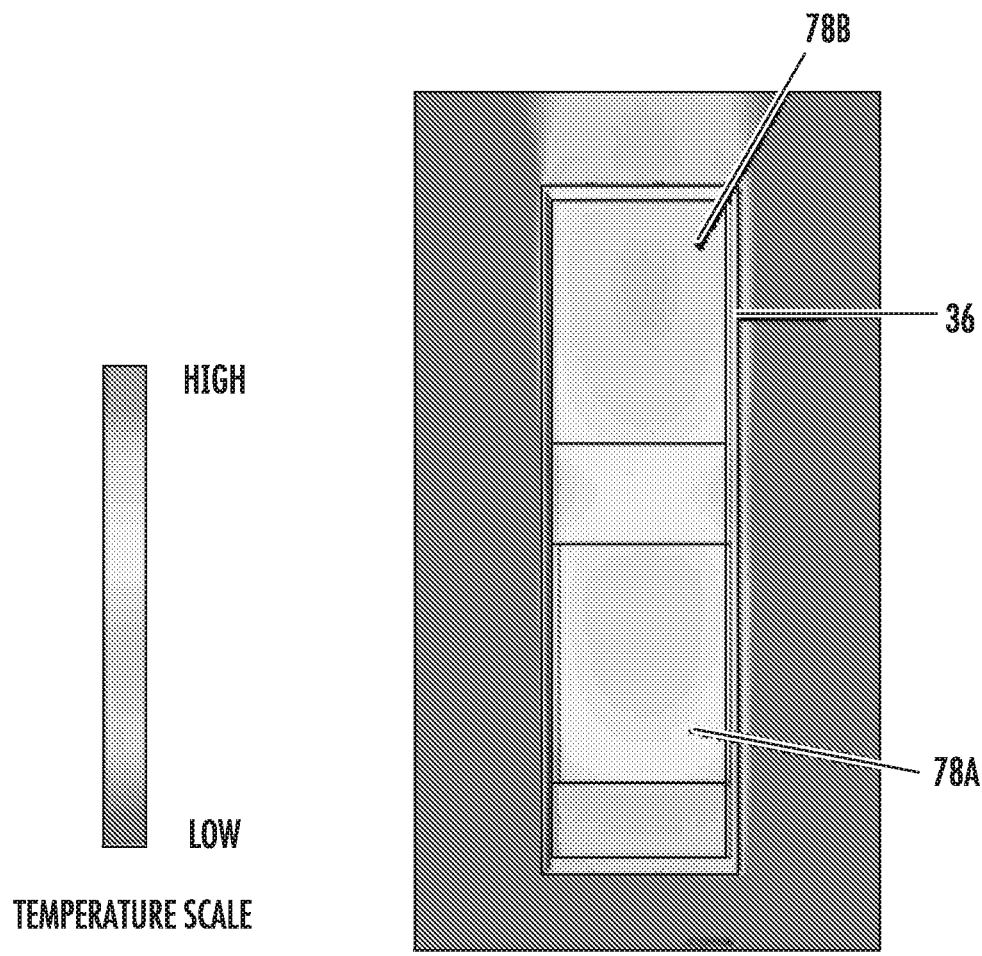
FIG. 21 shows temperature gradients within an electrical system that is cooled by the convection heatsink of FIG. 4 or FIG. 10 in accordance with the principles of the disclosure.

Referring again to the drawing figures in which like reference designators refer to like elements, a heatsink 22 for convection cooling is shown. Referring now to FIGS. 4-6, a side perspective view of a heatsink 22 is shown in FIG. 4, a rear view of a heatsink 22 is shown in FIG. 5, and a side views of a heatsink 22 is shown in FIG. 6. The heatsink 22 generally includes a base plate 24 (shown in FIGS. 4 and 6), and an airflow portion that includes a baffle 26 and a plurality of heat-dissipating elements 28. In one embodiment, the plurality of heat-dissipating elements 28 is comprised of a plurality of fins. The heatsink 22 has a lower or first end 30, an upper or second end 32 opposite the first end 30, and a longitudinal axis 34 (shown in FIG. 4) extending therebetween. The heatsink 22 may be mounted or located immediately proximate to at least one electrical system 36 (shown in FIGS. 4 and 6) having at least one heat-generating component (for example, as shown in FIG. 21), and the heatsink 22 may be used in any orientation. In one non-limiting configuration, the heatsink 22 is vertically mounted or coupled to an electrical system 36 such as a vertical radio unit. In one or more embodiments, electrical system 36 may correspond to electronics associated with a 5G, NR and/or LTE base station or network node having one or more electronic components that generate heat, i.e., one or more heat-generating components.

Continuing to refer to FIGS. 4-6, in one embodiment each the plurality of heat-dissipating elements 28 is a fin that includes a lower or first segment 38, an upper or second segment 40, and an intermediate or third segment 42 between the first and second segments 38, 40 (shown in FIGS. 4 and 6). The heat-dissipating elements 28 and the baffle 26 are sized and configured such that they direct a flow of a fluid, such as air, therethrough to transfer heat away from electrical component(s) of the electrical system 36. In one embodiment, the longitudinal axis 34 of the heatsink is at least substantially parallel to a longitudinal axis of the electrical system 36 such as a radio unit, and the heat-dissipating elements 28 extend at least substantially parallel to the longitudinal axis 34 of the heatsink 22 and extend orthogonal to, or at least substantially orthogonal to, a surface of the electrical system 36 (such as a rear surface of a radio unit of a base station or network node). In one embodiment, the heat-dissipating elements 28 and the base plate 24 are co-extruded as a single piece of material. In another embodiment, each heat-dissipating element 28 is extruded individually and a plurality of heat-dissipating elements 28 are attached or affixed to the base plate 24, such as by fasteners, adhesives, chemical bonding, thermal bonding, soldering, or the like. The heat-dissipating elements 28 and base plate 24 are composed of at least one thermally conductive material, such as metal (for example, copper, aluminum, and/or alloys thereof). In yet another embodiment, the heatsink 22 (for example, the base plate 24 and the heat-dissipating elements 28) is made using a die casting process.

Figure 7:
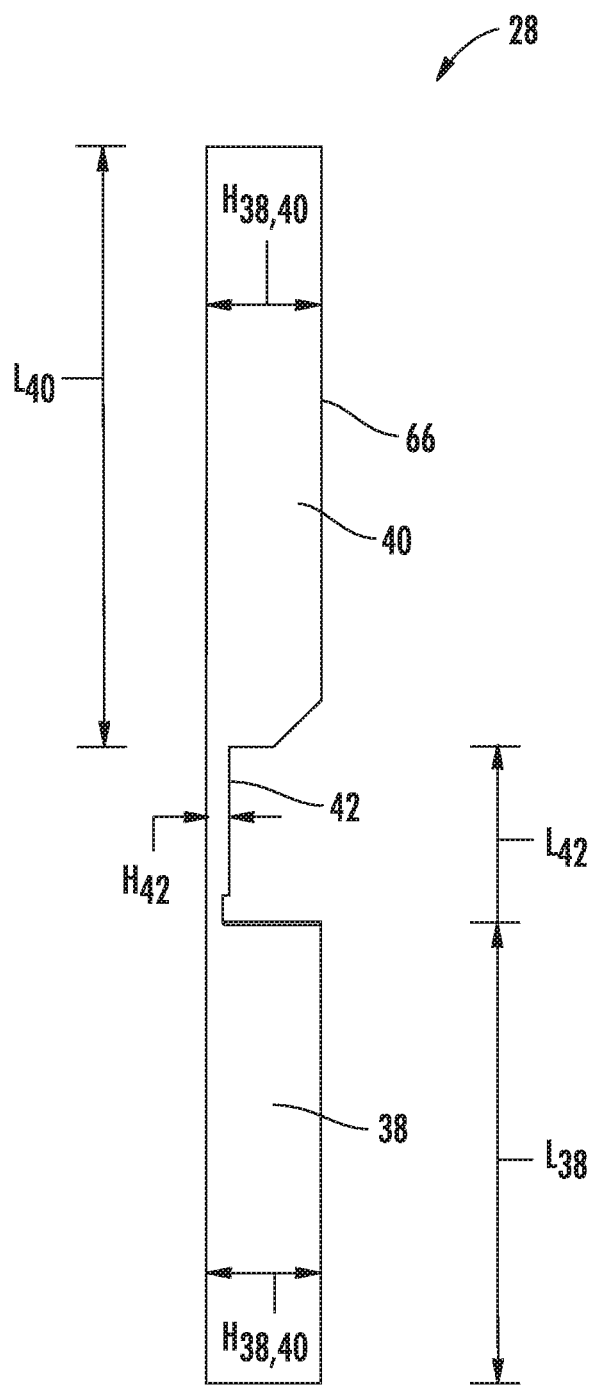
FIG. 7 shows a side view of a heat-dissipating element of the heatsink of FIG. 4 in accordance with the principles of the disclosure.

Referring now to FIG. 7, a heat-dissipating element 28 of the heatsink 22 is shown in greater detail. In one embodiment, the heat-dissipating element 28 is a fin and the first segment 38 and the second segment 40 of each heat-dissipating element 28 has substantially the same maximum height $H_{38,40}$ from the base plate 24 (base plate 24 not shown in FIG. 7). The third segment 42 has a maximum height $H_{42}$ that is less than the maximum height $H_{38,40}$ of the first and second segments 38, 40. As is further shown in FIG. 7, the length $L_{38}$ of the first segment 38 of each heat-dissipating element 28 may be the same or different than the length $L_{40}$ of the second segment 40. In one embodiment, the length $L_{42}$ of the third segment 42 is less than either of the length $L_{38}$ of the first segment 38 and the length $L_{40}$ second segment 40. However, it will be understood that the first, second, and third segments 38, 40, 42 may have any suitable proportions (for example, the third segment 42 may have a length that is longer than the first segment 38 and/or the second segment 40) and configurations. Further, in one embodiment the first and second segments 38, 40 of each heat-dissipating element 28 have the same maximum height $H_{38,40}$, but the maximum height $H_{38,40}$ of each heat-dissipating element 28 are different (or, put another way, fewer than all of the plurality of heat-dissipating elements 28 have the same maximum height $H_{38,40}$). Also, in some embodiments, the heat-dissipating elements 28 have sizes, shapes, and/or arrangements different than those shown in the figures. For example, the heatsink 22 may include pin fins, each heat-dissipating element may be divided into additional segments, and/or the lower segments of the heat-dissipating elements 28 (or lower heat-dissipating elements) may have a different design, distribution, and/or configuration than the upper segments of the heat-dissipating elements 28 (or upper heat-dissipating elements). As an additional example, the heat-dissipating elements may be arranged in a linear pattern, staggered pattern, may be randomly distributed across the base plate 24, and/or may have other arrangements suitable for directing airflow through the heatsink 22. In some embodiments, the heatsink 22 may also be comprised of other extruded shapes, such as tubular and/or rectangular heat-dissipating elements, in which heat carrying channels are formed.

Figure 8:
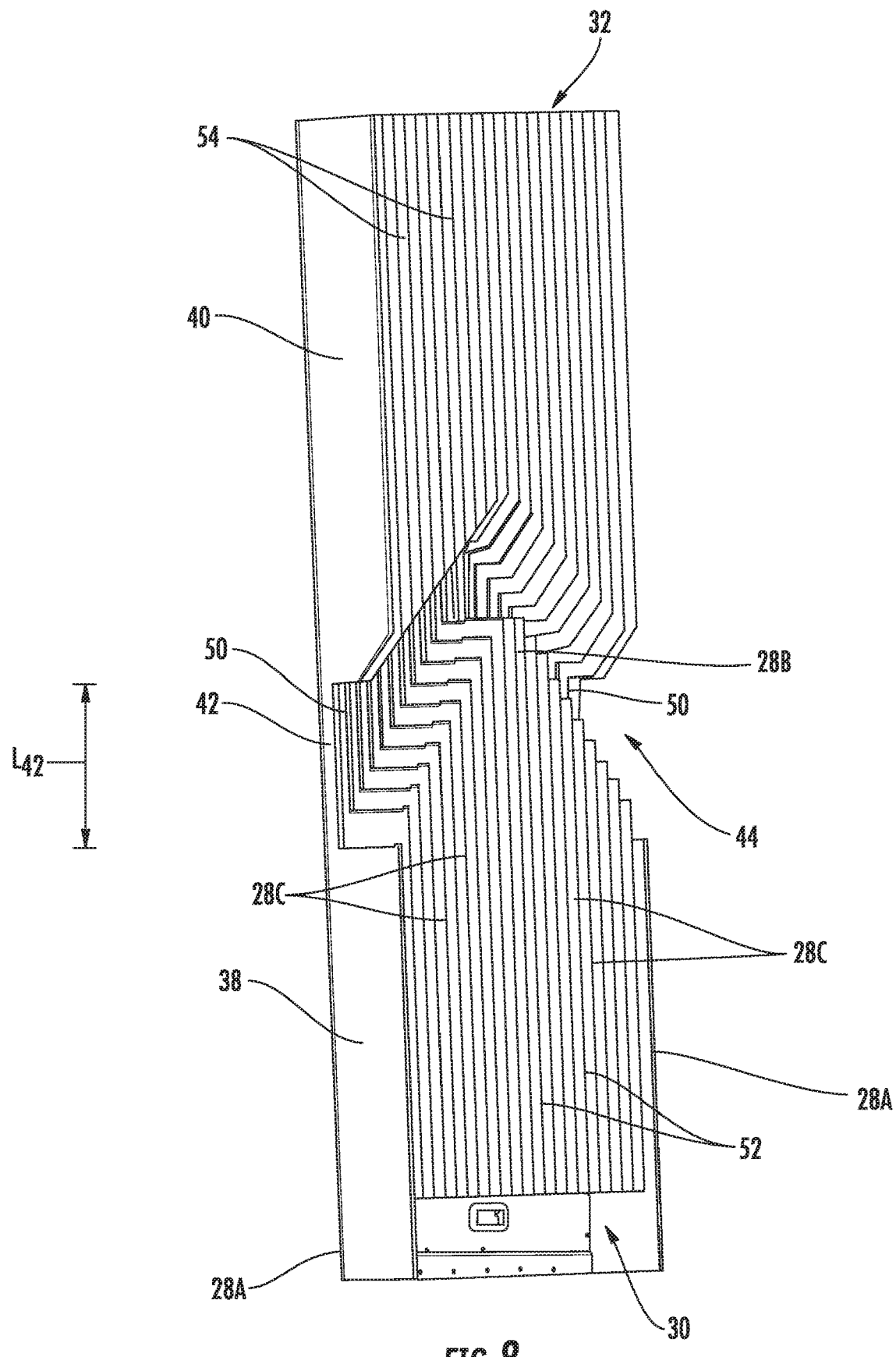
FIG. 8 shows the heatsink of FIG. 4, with the baffle removed, in accordance with the principles of the disclosure.

Referring now to FIG. 8, a heatsink is shown without a baffle 26 for visualization of an inlet channel 44 between the first segments 38 and the second segments 40 of the heat-dissipating elements 28. In one embodiment, the heat-dissipating elements 28 (indicated by numbers 28A, 28B, and 28C in FIG. 8) are evenly spaced to define airflow channels therebetween all having the same width. However, it will be understood that the heat-dissipating elements 28 may instead be unevenly spaced and, therefore, the airflow channels may have different widths. A plurality of first airflow channels 52 are defined between the first segments 38 of adjacent heat-dissipating elements 28 and a plurality of second airflow channels 54 are defined between the second segments 40 of adjunct heat-dissipating elements 28. Air may enter the heatsink 22 at the first end 30 through the first airflow channels 52, and air may then pass into the inlet channel 44, which is between the first airflow channels 52 and second airflow channels 54 and, as discussed below, also provides additional locations at which air may enter the heatsink 22.

Continuing to refer to FIG. 8, in one embodiment the plurality of heat-dissipating elements 28 is comprised of a plurality of fins including two outermost fins 28A, at least one central fin 28B, and at least one intermediate fin 28C between the each of the outermost fins 28A and the central fin 28B. It is noted that unless a particular one of the outermost, central, and intermediate fins 28A, 28B, 28C are discussed, the heat-dissipating elements (for example, fins) 28 are generally discussed herein with reference to number "28". In one embodiment, all of the heat-dissipating elements 28 have the same overall length (with, in some embodiments, the overall length of the outermost fins 28A being longer). However, the lengths of the first segments 38 and the second segments 40 may be different. Further, the shape of the inlet channel 44 is determined at least in part by the lengths of the first and second segments 38, 40 and, therefore, the lengths of the third segments 42. As shown in FIG. 8, in one embodiment the inlet channel 44 is between the first segments 38 and second segments 40 of the heat-dissipating elements 28, and the location and width of the inlet channel 44 is at least partially determined by the location and width of the third segments 42 of the heat-dissipating elements 28. Put another way, the first and second segments 38, 40 of each heat-dissipating element are separated by a distance equal to the length $L_{42}$ of the third segment 42. The inlet channel 44 is an at least substantially transverse channel extending across the longitudinal axis 34 and between a first edge 46 of the heatsink 22 and a second edge 48 of the heatsink 22, regardless of the actual shape of the inlet channel 44. As is discussed in greater detail below, the space between the first and second segments 38, 40 of each of the outermost fins 28A at least partially defines an inlet 50 to the inlet channel 44, through which "fresh" or cooler air may be drawn in from the environment surrounding the heatsink 22. Thus, the heatsink 22 includes inlets that draw in cooling air at locations additional to the first end 30 of the heatsink 22 (for example, on the sides of the heatsink 22 between the first and second ends 30, 32).

Continuing to refer to FIG. 8, in one embodiment the length of the first segments 38 of the outermost fins 28A are the same, with the length of each first segment 38 of the outermost fins 28A being less than the length of the first segment of the central fin 28B. Likewise, the length of each of the second segments 40 of the outermost fins 28A are the same, with the length of each second segment 40 of the outermost fins 28A being greater than the length of the second segment 40 of the central fin 28A. In one embodiment, the lengths of the first segments 38 of the intermediate first fin(s) 28C gradually increase from the outermost fins 28A to the central fin 28B and the length of the second segments 40 of the intermediate fin(s) 28C gradually decrease from the outermost fins 28A to the central fin 28B. In this configuration, the inlet channel 44 in one embodiment has a chevron shape (for example, as shown in FIG. 8). In other embodiments, the inlet channel 44 may have another shape, such as linear, and is not limited to the chevron shape as shown in FIG. 8. Further, it will be understood that the inlet channel 44 and heat-dissipating elements 28 may be of any suitable size and configuration that allows at least a portion of the baffle 26 to be received within the inlet channel 44 (and between first segments 38 and second segments 40 of the heat-dissipating elements 28).

Figure 9:
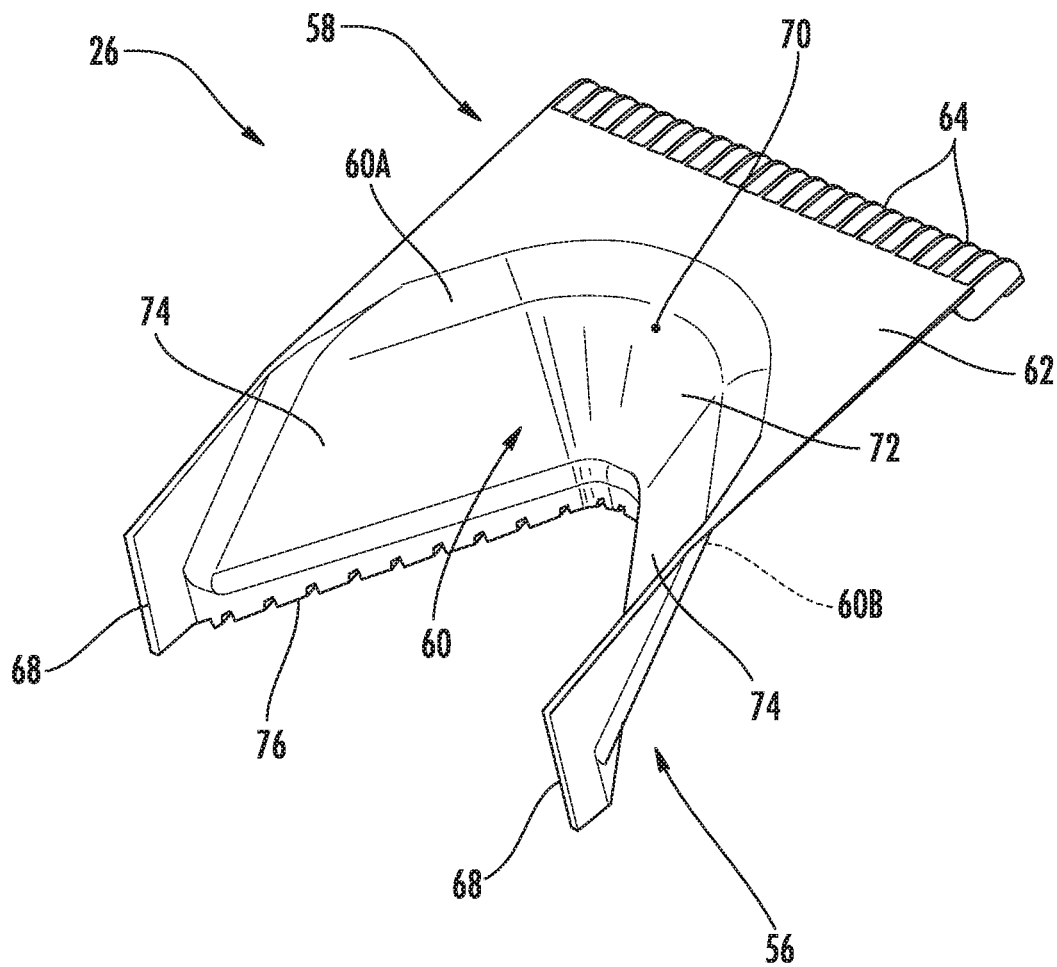
FIG. 9 shows the baffle of FIG. 4 in greater detail in accordance with the principles of the disclosure.

Referring now to FIG. 9, the baffle 26 is shown and discussed in greater detail. The baffle 26 is sized and configured such that at least a portion of the baffle 26 fits within the inlet channel 44 (not shown in FIG. 9). Further, in one embodiment the baffle 26 is coupled to or secured between the first segments 38 and/or second segments 40 of the heat-dissipating elements 28. In one embodiment, the portion of the baffle 26 that fits within the inlet channel 44 is sized such that the baffle 26 is friction fit to at least one heat-dissipating element 28. Additionally or alternatively, the baffle 26 is coupled to the first and/or second segments 38, 40 of the heat-dissipating elements 28 with one or more mechanical coupling elements, such as thermal tape, wires, clips, stand-offs, snaps, clamps, screws, pins, or the like (not shown) and/or by chemical or thermal coupling (for example, adhesives, chemical welding, thermal welding, soldering, or the like). However, it will be understood that any suitable coupling method(s) or device(s) may be used.

In one embodiment, the baffle 26 is composed of a thermally conductive material, such as metal, and may be composed of the same material from which the heat-dissipating elements 28 and/or the base plate 24 are composed. In another embodiment, the baffle 26 is composed of a thermally insulated material, a heat-resistant material, and/or a material having a low thermal conductivity (for example, plastic, rubber, ceramic, or polyimide).

Continuing to refer to FIG. 9, the baffle 26 generally includes a lower or first portion 56, an upper or second portion 58 opposite the first portion 56, and a scoop 60. In one embodiment, the second portion 58 lies substantially within a first plane and includes a shield portion 62 that is planar or at least substantially planar. In the embodiment shown in FIG. 9 (and FIGS. 4-6), the shield portion 62 includes a plurality of projections 64. In one embodiment, the baffle 26 includes the same number of projections 64 as the number of heat-dissipating elements 28. In one embodiment each projection 64 is configured to contact at least a portion of the second segment 40 of a corresponding heat-dissipating element 28 when the baffle 26 is coupled within the inlet channel 44 (for example, as shown in FIG. 4). For example, each heat-dissipating element 28 has a free edge 66 and each projection 64 is in contact with the free edge 66 of a corresponding heat-dissipating element 28. Each projection 64 has a height that is configured to position at least the shield portion 62 of the baffle 26 at a desired distance from the heat-dissipating elements 28. Preserving a distance between the shield portion 62 and the heat-dissipating elements 28 not only reduces the amount of warm air that re-enters the second airflow channels 54 after exiting the baffle 26, but also may increase the amount of cooling air entering the heatsink 22.

Continuing to refer to FIG. 9, in one embodiment, the first portion 56 includes at least one lower edge 68 that defines a height of the baffle 26 and that, in one embodiment, lies in a plane that is orthogonal to, or at least substantially orthogonal to, the plane in which the second portion 58 lies. Further, at least a portion of the first portion 56 lies in a plane that is different than the plane in which the second portion 58 lies. However, it will be understood that the first portion 56, as well as the second portion 58, may have any suitable size, shape, and configuration that allows at least a portion of the baffle 26 to fit (and, optionally, to be secured within) the inlet channel 44.

Continuing to refer to FIG. 9, in one embodiment, the scoop 60 extends between the shield portion 62 and at least a portion of the first portion 56 that lies in a plane different than the plane in which the shield portion 62 lies. In one embodiment, at an imaginary center point 70, at least a portion of the scoop 60 generally extends at an angle from the second portion 58 to the first portion 56. In one non-limiting example, the angle is between 20° and 90°. Further, the angle may vary at different locations in the scoop 60. In one embodiment, the scoop 60 is not planar, but instead includes a central portion 72 and sidewall 74 on either side of the central portion 72. The sidewalls 74 may prevent warm air that is directed away from the baffle 26 from re-entering the heatsink 22, such as being drawn from the baffle 26 into the inlets 50 (and then into the second airflow channels 54). The scoop 60 includes a first surface 60A and a second surface 60B opposite the first surface 60A. In one embodiment, the first surface 60A is in contact with a first fluid flow (for example, air such as warm air from the first airflow channels 52) and the second surface 60B is in contact with a second fluid flow (for example, air such as cooler air drawn into the inlet channel 44 from the environment in which the heatsink 22 is located) when the heatsink 22 is in use. Further, at least a portion of the second surface 60B may be obscured from view when the heatsink 22 is in use (for example, as shown in FIG. 5).

Continuing to refer to FIG. 9, in one embodiment, the scoop 60 may include an edge 76 that is contoured to generally follow the configuration of the inlet channel 44. For example, the edge 76 is shaped according to the lengths of the first segments 38 of the heat-dissipating elements 28 and locations of the ends of the first segments 38 abutting the inlet channel 44. In the embodiment shown in the figures, the edge 76 has a chevron shape to fit within the chevron-shaped inlet channel 44. However, it will be understood that the edge 76 may have any size, shape, and configuration suitable for use within the inlet channel 44. When the heatsink 22 is assembled, a fluid passage (inlet channel) is defined between the floor of the inlet channel 44 (which is at least partially defined by the third segments 42 of the heat-dissipating elements 28 and/or the base plate 24) and at least a portion of the baffle 26, such as the second surface 60B of the scoop 60 and a surface (such as the underside) of the shield portion 62. Thus, a fluid inlet 50 is formed on either end of the inlet channel 44.

Figure 10:
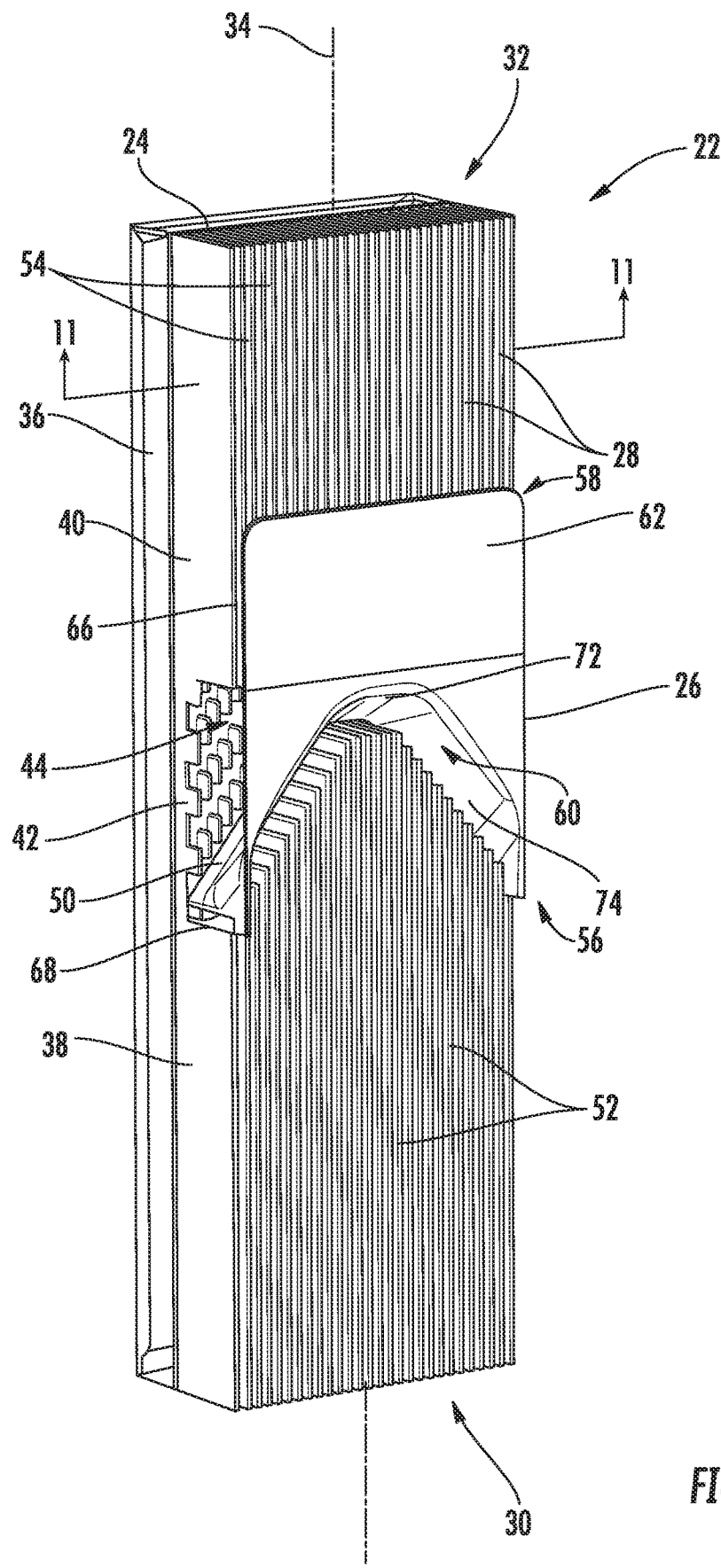
FIG. 10 shows an exemplary heatsink for convection cooling having a plurality of heat-dissipating elements and another exemplary baffle in accordance with the principles of the disclosure.

Referring now to FIG. 10, a heatsink 22 having another exemplary baffle 26 is shown. The heatsink 22 of FIG. 10 is generally the same as that of FIGS. 4-8, and the same reference numbers are used. Further, the baffle 26 of the heatsink 22 of FIG. 10 is generally the same as the baffle 26 shown in FIG. 9, and includes a lower or first portion 56, an upper or second portion 58 opposite the first portion 56, and a scoop 60. In one embodiment, the second portion 58 lies substantially within a first plane and includes a shield portion 62 that is planar or at least substantially planar. However, unlike the baffle 26 shown in FIG. 9, the shield portion 62 of the baffle of the heatsink shown in FIG. 10 is without the plurality of projections (indicated with number 64 in FIG. 9). Nonetheless, the shield portion 62 is configured to be located at a desired distance from the free edges 66 of the heat-dissipating elements 28. Additionally, in one embodiment, the third segment 42 of each heat-dissipating element 28 includes one or more ridges, which determine the maximum height $H_{42}$ of the third segment 42.

Figure 11:
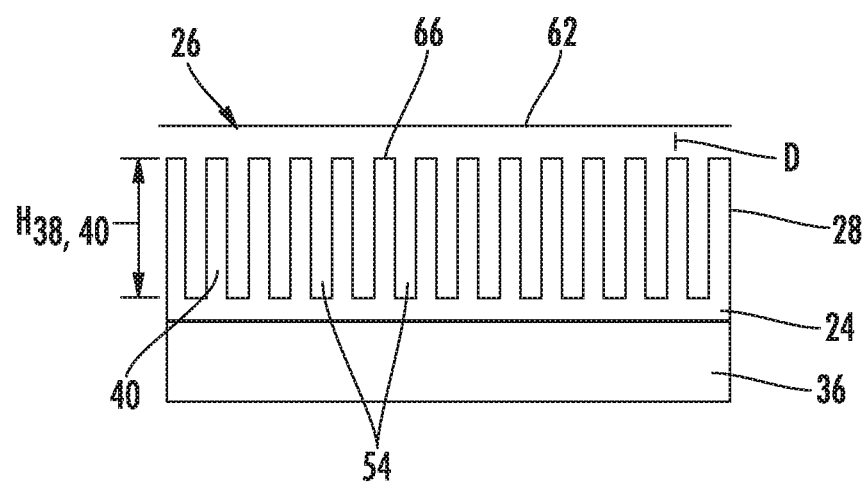
FIG. 11 shows a cross-sectional view of the heatsink of FIG. 10 along line 11-11 in FIG. 10 in accordance with the principles of the disclosure.

Referring now to FIG. 11, a cross-sectional view of the heatsink 22, taken along line 11-11 in FIG. 10, is shown. In the embodiment shown in FIG. 11, the second segments 40 of the heat-dissipating elements 28 all have the same height $H_{38,40}$ and the shield portion 62 is planar or at least substantially planar. The baffle 26 is configured such that a distance D is maintained between the shield portion 62 and the free edges 66 of the heat-dissipating elements. In one embodiment, the distance D is a constant distance across the heatsink 22 (that is, the distance between the free edge 66 of each heat-dissipating element 28 and the shield portion 62 is the same). However, in other embodiments, the distance D between the free edges 66 and the shield portion 62 is not a constant distance across the heatsink 22 (that is, the distances between the free edges 66 of the heat-dissipating elements 28 and the shield portion 62 are not the same). It will be understood that a cross-sectional view of the heatsink 22 of FIG. 4, without the projections 64 shown, could look the same or substantially the same. That is, the shield portion 62 of the baffle 26 is separated from the free edges 66 of the heat-dissipating elements 28, regardless of whether the baffle 26 includes projections 64 as shown, for example, in FIG. 9.

Figure 12:
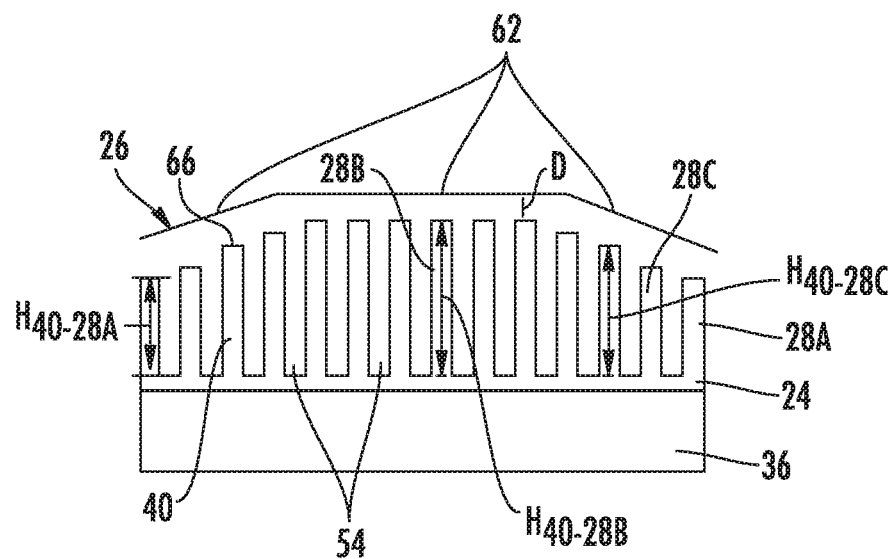
FIG. 12 shows a cross-sectional view of an exemplary heatsink having another exemplary baffle in accordance with the principles of the disclosure.

Referring now to FIG. 12, a cross-sectional view of the heatsink 22 is shown. At least the second segments 40 of the heat-dissipating elements 28 have different heights and the shield portion 62 of the baffle 26 is configured to contour the free edges 66 of the heat-dissipating elements 28 such that a distance D is maintained between the shield portion 62 and the free edges 66 of the heat-dissipating elements 28. In one embodiment, a constant distance D is maintained between the shield portion 62 and the free edges 66 of the heat-dissipating elements 28 across the heatsink 22, regardless of the height of the second segments 40 (that is, the distance between the free edge 66 of each heat-dissipating element 28 and the shield portion 62 is the same). However, in other embodiments, the distance D is not a constant distance across the heatsink 22 (that is, the distances between the free edges 66 of the heat-dissipating elements 28 and the shield portion 62 are not the same). In the embodiment shown in FIG. 12, the second segments 40 of the heat-dissipating elements 28 have different heights. For example, the heat-dissipating elements 28 are comprised of a plurality of fins including two outermost fins 28A, at least one central fin 28B, and at least one intermediate fin 28C between each of the two outermost fins 28A and the at least one central fin 28B. In one embodiment, at least the second segments 40 of the outermost fins 28A have a first height $H_{40-28A}$, at least the second segments 40 of the central fin(s) 28B has a second height $H_{40-28B}$, and at least the second segments 40 of the intermediate fins 28C have at least a third height $H_{40-28C}$, but in some embodiments have a variety of heights (for example, as shown in FIG. 12). In one embodiment, such as is shown in FIG. 12, the cross-sectional shape of the second segments 40 of the heat-dissipating elements 28 is generally curved, with the central fin(s) 28B being higher than the outermost fins 28A and the intermediate fin(s) 28C. The baffle 26 is configured such that a distance D is maintained between the shield portion 62 and the free edges 66 of the heat-dissipating elements. In one embodiment, the distance D is a constant distance across the heatsink 22. Thus, the shield portion 62 may include more than one planar portion and/or may be curved to contour the free edges 66 of the heat-dissipating elements 28. It will be understood that the heat-dissipating elements 28 may have other cross-sectional shapes and, regardless of the heights and/or height differences between the second segments of the heat-dissipating elements 28, the shield portion 62 is shaped accordingly to maintain a distance D between the shield portion 62 and the free edges 66 of the heat-dissipating elements 28.

Figure 13:
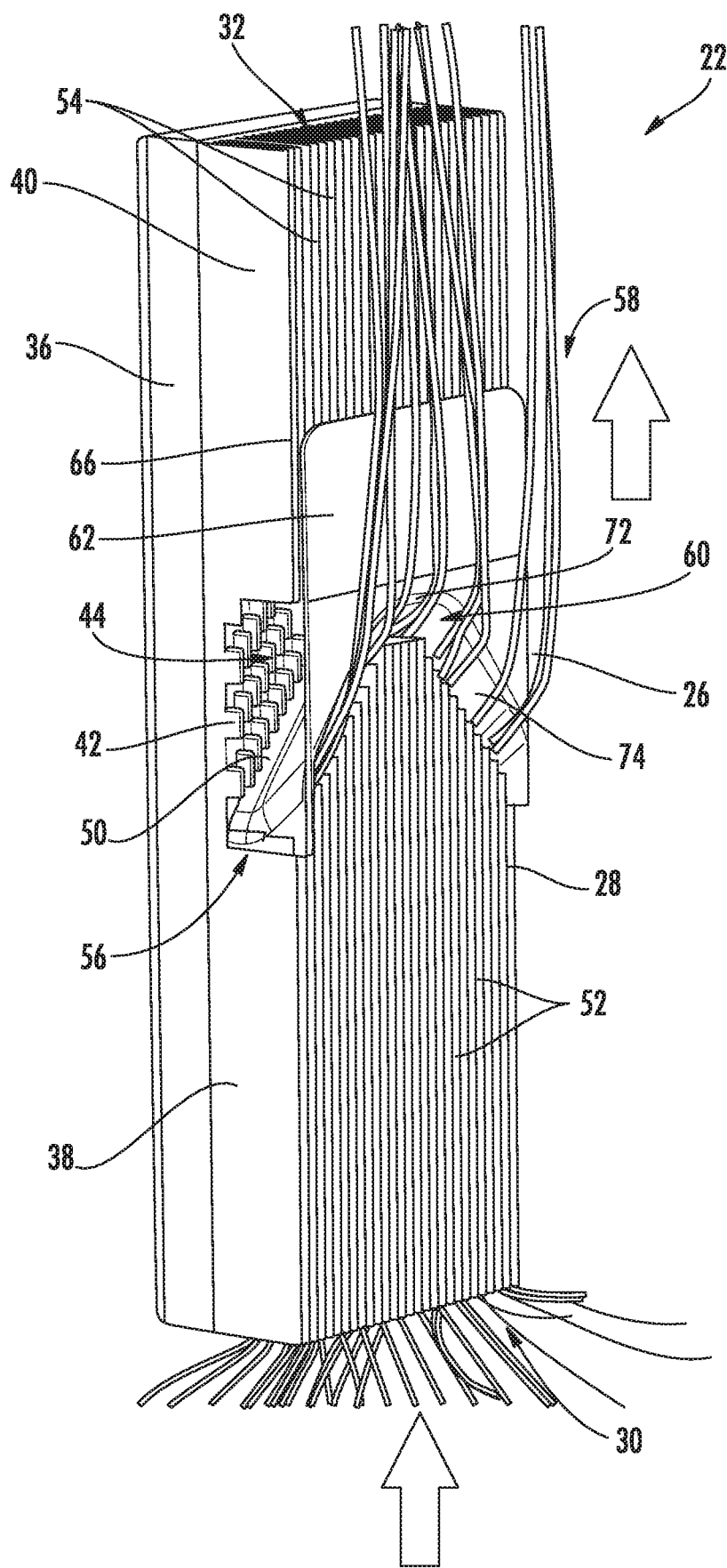
FIG. 13 shows a side perspective view of airflow from the lower heat-dissipating elements and into the baffle of a heatsink for convection cooling in accordance with the principles of the disclosure.
Figure 14:
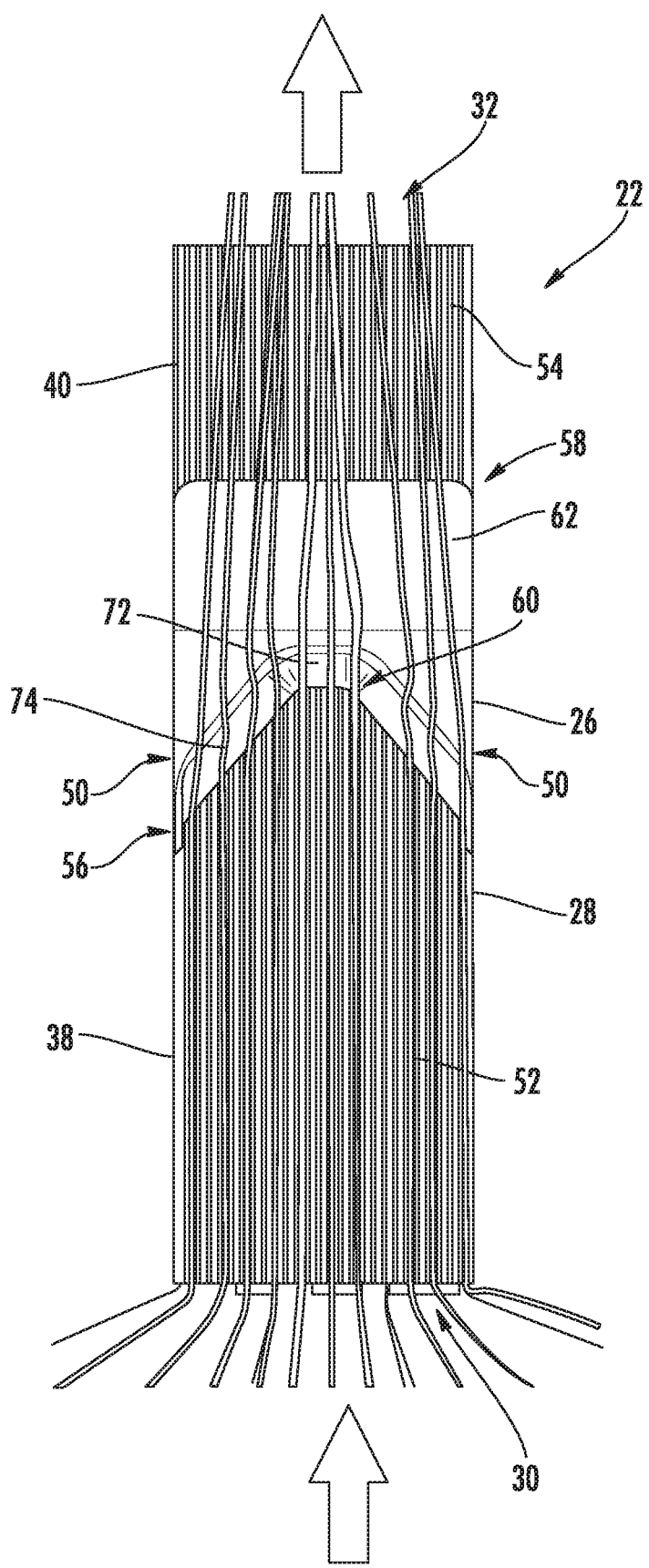
FIG. 14 shows a rear view of the airflow shown in FIG. 13 in accordance with the principles of the disclosure.
Figure 15:
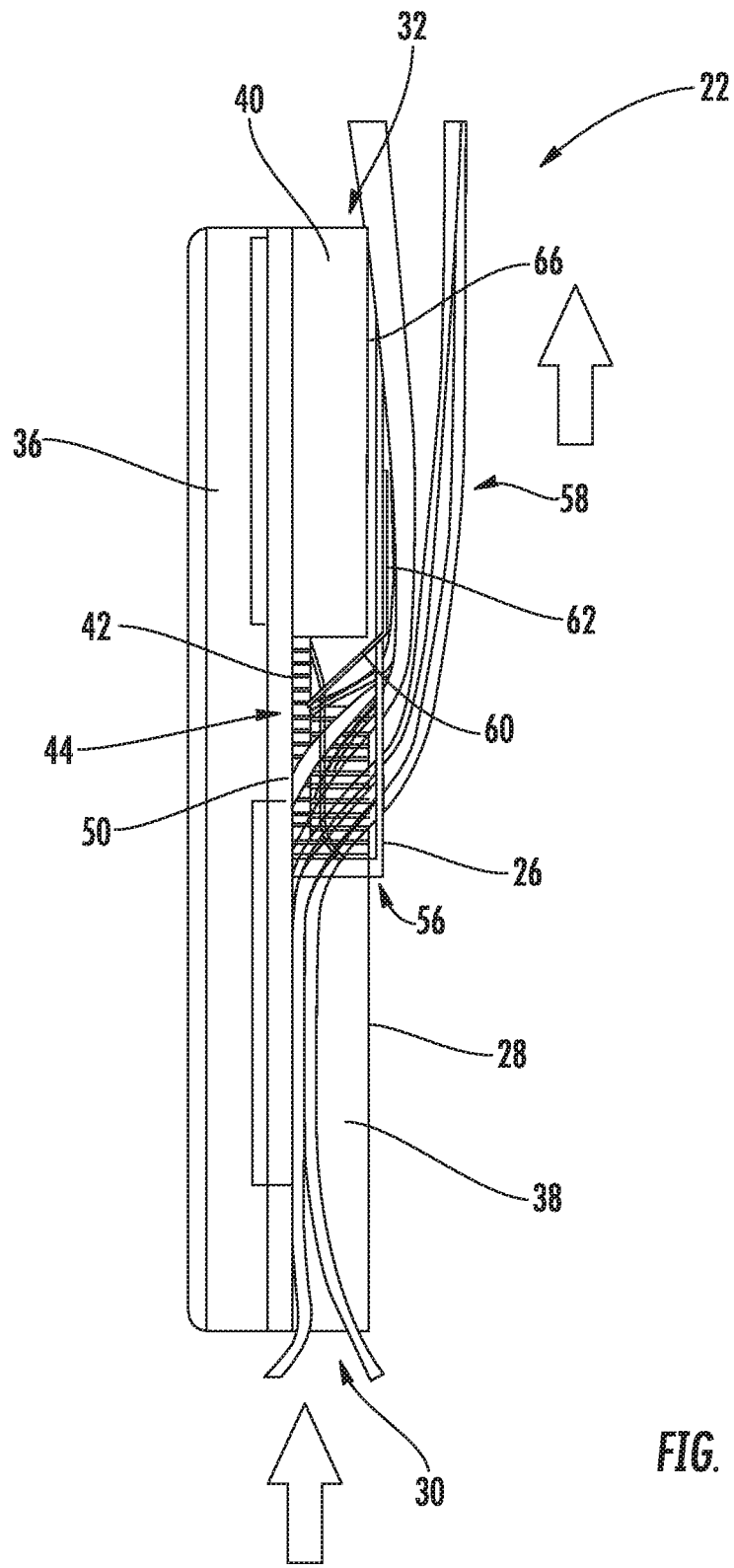
FIG. 15 shows a side view of the airflow shown in FIG. 13 in accordance with the principles of the disclosure.
Figure 16:
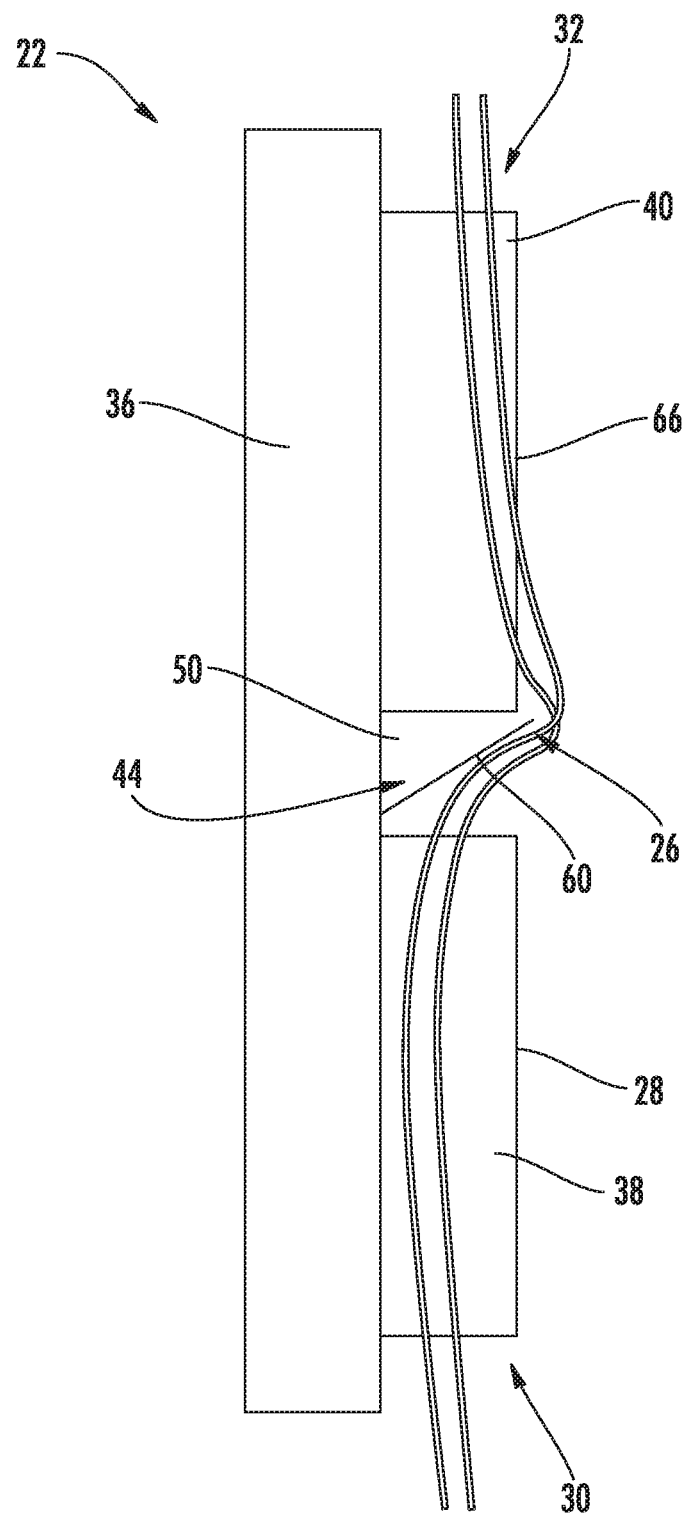
FIG. 16 shows a stylized side view of the airflow shown in FIG. 13, wherein the baffle does not include a shield portion, for comparison with FIG. 17.
Figure 17:
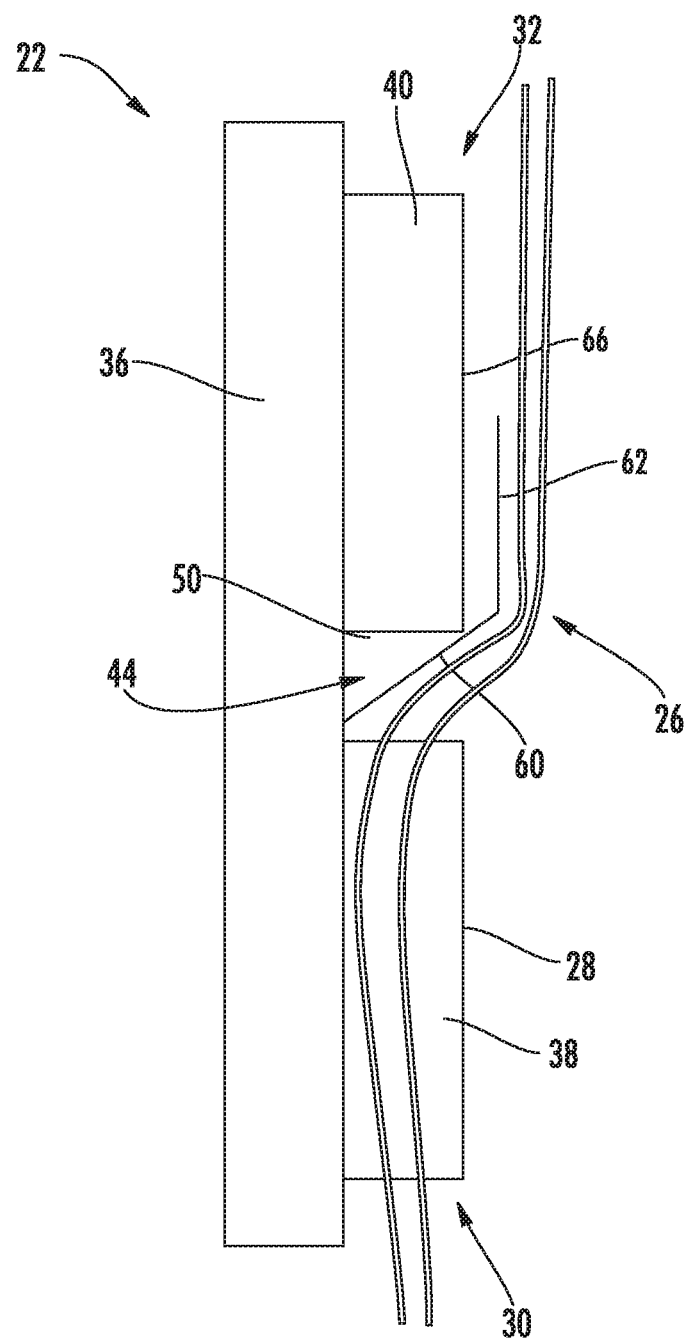
FIG. 17 shows a stylized side view of the airflow shown in FIG. 13, wherein the baffle does include a shield portion in accordance with the principles of the disclosure.
Figure 18:
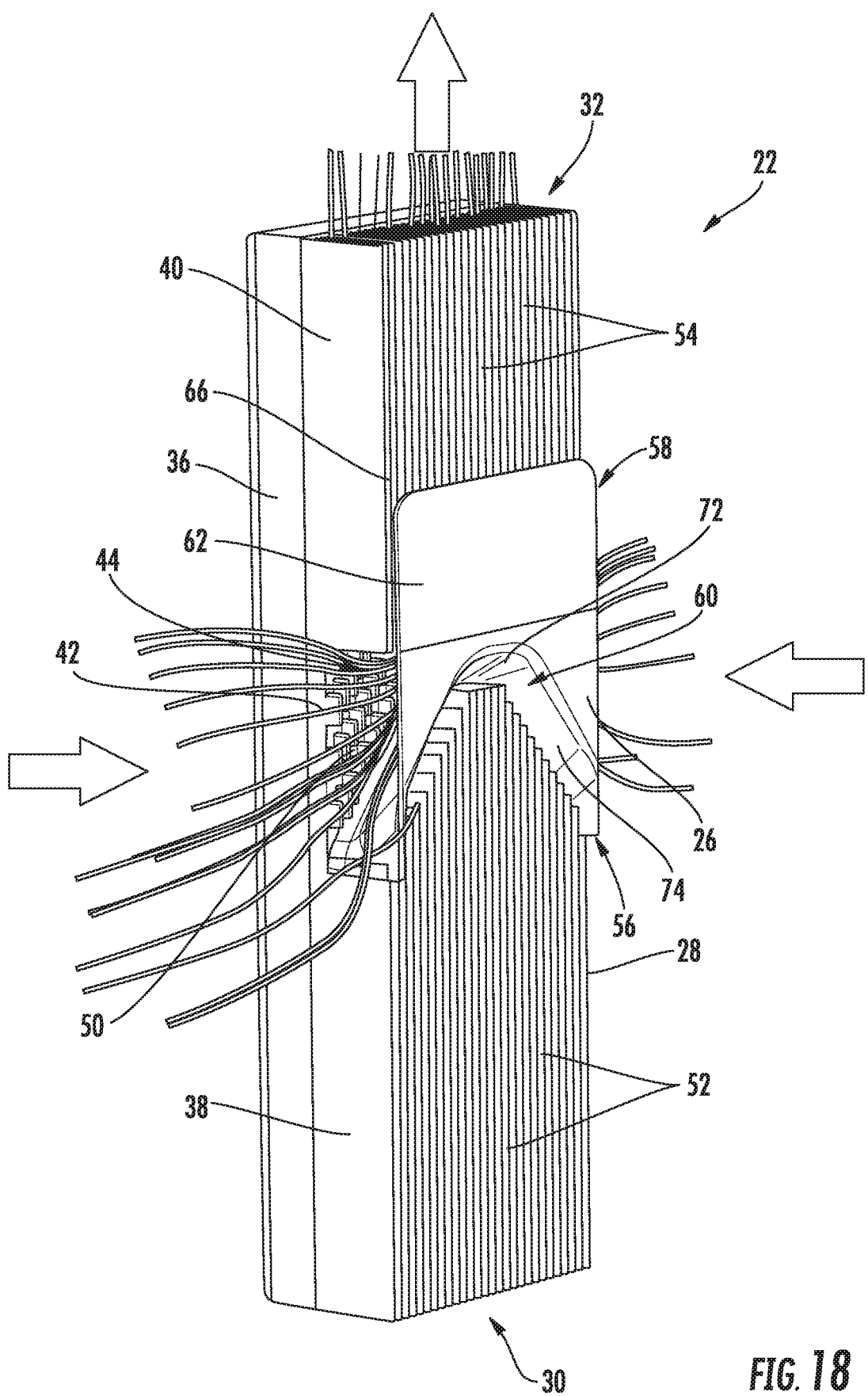
FIG. 18 shows a side perspective view of airflow into the inlet channel and then into the upper heat-dissipating elements of a heatsink for convection cooling in accordance with the principles of the disclosure.
Figure 19:
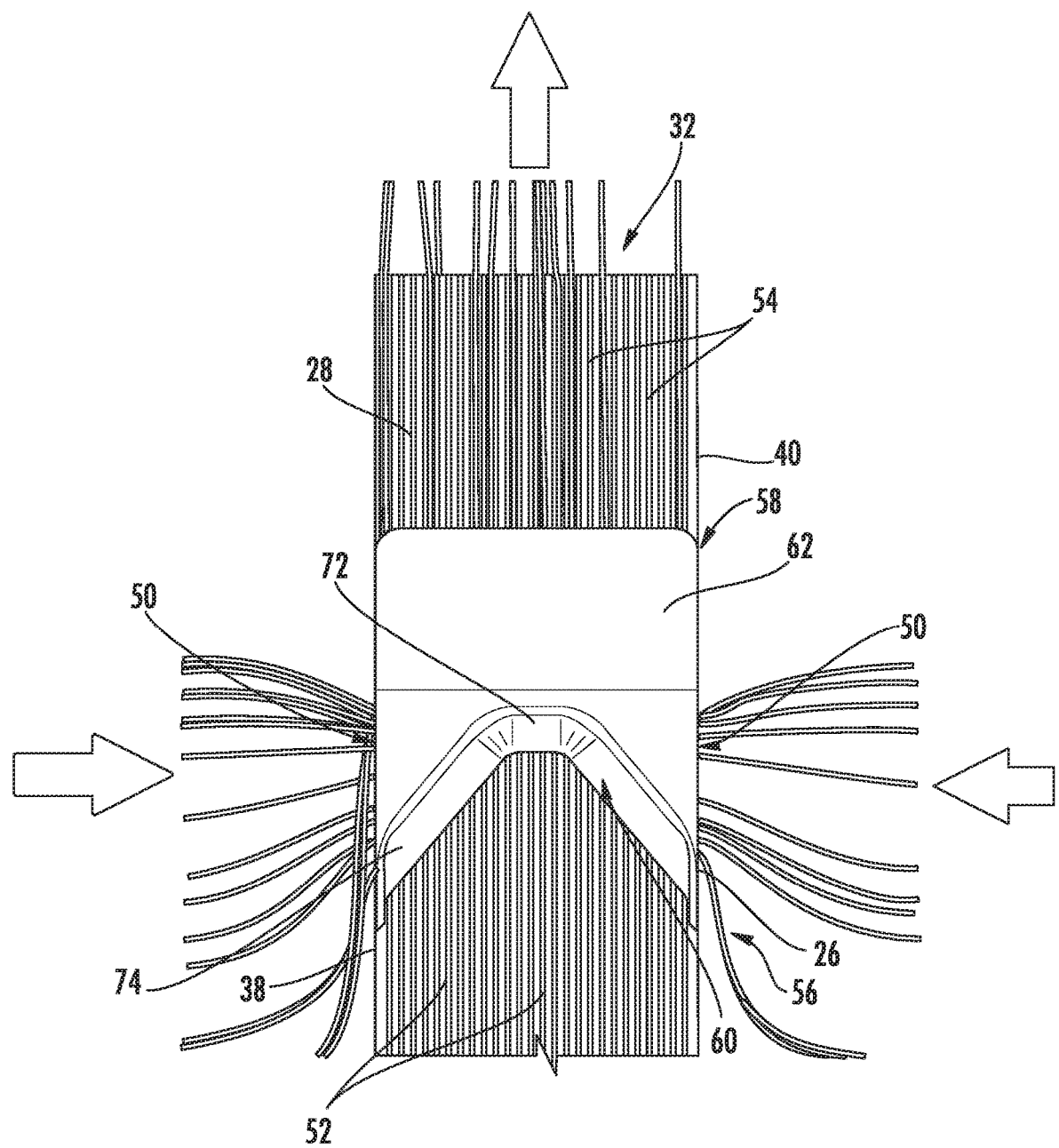
FIG. 19 shows a rear view of the airflow shown in FIG. 18 in accordance with the principles of the disclosure.
Figure 20:
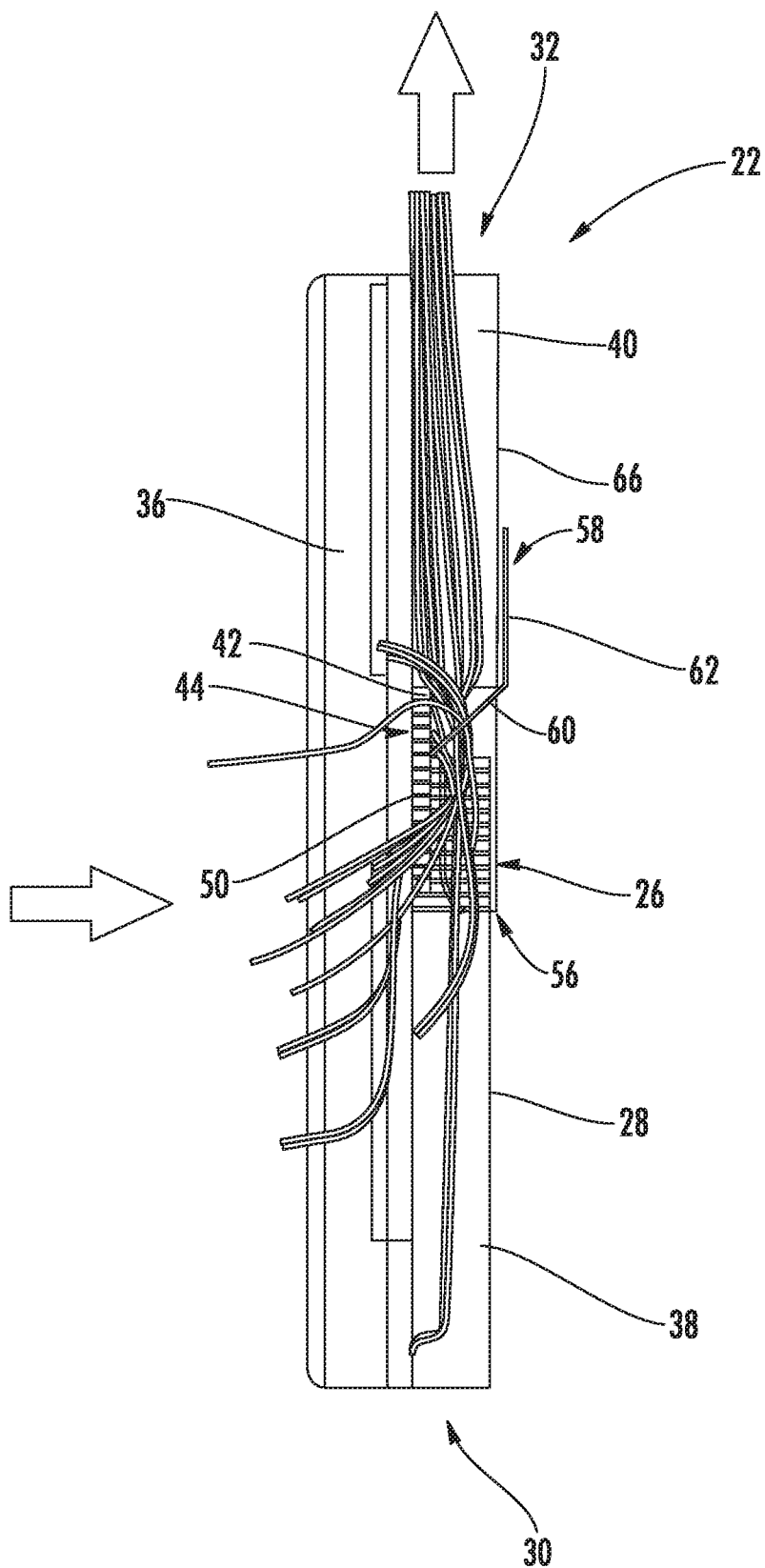
FIG. 20 shows a side view of the airflow shown in FIG. 18 in accordance with the principles of the disclosure.

Referring now generally to FIGS. 13-20, airflow through the heatsink 22 is shown and discussed in greater detail. The baffle 26 may have any size, shape, and configuration that allows it to simultaneously direct a first fluid flow in a first direction (or along a first flow path) and a second fluid flow in a second direction (or along a second flow path). Put another way, the baffle 26 is configured to simultaneously direct warm air from the lower portion of the heatsink 22 away from the heatsink 22 (for example, out the rear of the heatsink 22) and to draw cooler air in through the sides of the heatsink 22 and into the upper portion of the heatsink 22. The baffle 26 is further configured to reduce or prevent warm air, once removed from the heatsink 22, from re-entering the heatsink 22, such as re-entering the upper portion. It will be noted that the first and second fluid flows are shown separately for clarity and ease of understanding (an exemplary first fluid flow is shown in FIGS. 13-15 and an exemplary second fluid flow is shown in FIGS. 18-20), but it is understood that these fluid flows may occur simultaneously and are not mutually exclusive. In one embodiment, the baffle 26 directs a first fluid flow from a first portion of the airflow channels (for example, from the first airflow channels 52) and directs a second fluid flow into a second portion of the airflow channels (for example, into the second airflow channels 54). Thus, the baffle 26 may serve as both a fluid inlet and a fluid outlet.

Referring now to FIGS. 13-15, the first fluid flow is shown, and general fluid flow direction is indicated with larger arrows, in a side perspective view (FIG. 13), a rear view (FIG. 14), and a side view (FIG. 15). In one embodiment the first fluid flow (such as warm air) is directed from the airflow channels 52 between the first segments 38 of the heat-dissipating elements 28, to the first portion 56 of the baffle 26 along the sidewalls 74 and/or the central portion 72 of the scoop 60, and then to the shield portion 62, from where the first fluid flow is free to exit the heatsink 22.

Referring now to FIG. 16, airflow through a heatsink 22 having a baffle 26 with only a scoop 60 and not a shield portion 62 is shown. If the heatsink 22 is vertically mounted to an electrical system 36, at least some of the warm air may continue to flow upward from the baffle 26, instead of being deflected away from the heatsink 22, and may re-enter the heatsink 22 at the second airflow channels 54.

Referring now to FIG. 17, airflow through a heatsink 22 having a baffle with both a scoop 60 and a shield portion 62 is shown. To help prevent and/or limit the amount of warm air that re-enters the heatsink 22 and to maintain the heat transfer capacity of the heat-dissipating elements 28, a shield portion 62 is used that deflects at least a portion of the airflow away from the second segments 40 of the heat-dissipating elements 28 and the second airflow channels 54, in contrast to the baffle shown in FIG. 16. In one embodiment, the projections 64 and/or the shield portion 62 of the baffle 26 (see FIG. 9) are sized and configured such that the shield portion 62 of the baffle 26 is positioned a predetermined distance from the heat-dissipating elements 28, which will help deflect the exiting warm air. The predetermined distance may be chosen based on the type of electrical system with which the heatsink is being used, as well as the amount of heat-generating components and the amount of heat they generate.

Referring now to FIGS. 18-20, the second fluid flow is shown, and general fluid flow direction is indicated with larger arrows, in a side perspective view (FIG. 18), a partial rear view (FIG. 19), and a side view (FIG. 20). In one embodiment the second fluid flow (such as "fresh" or cooler air) is directed from the atmosphere surrounding the heatsink 22 into the inlet channel 44 through one or both inlets 50, and then into the second airflow channels 54 between the second segments 40 of the heat-dissipating elements 28. The temperature of the second fluid flow as it enters the heatsink 22 at the baffle 26 (such as through the inlets 50) to the second airflow channels 54 may be less than the temperature of the first fluid flow as it exits the heatsink 22 at the baffle 26 (such as where it is directed away from the baffle 26 at the scoop 60) from the first airflow channels 52. Due to the spacing between the shield portion 62 of the baffle 26 and the heat-dissipating elements 28, some ambient air may also flow under the shield portion 62 and enter the second airflow channels 54 from the atmosphere surrounding the heatsink 22. Thus, the amount of cooling air entering the heatsink 22 may be increased by the configuration of the baffle 26 discussed herein.

Figure 3:
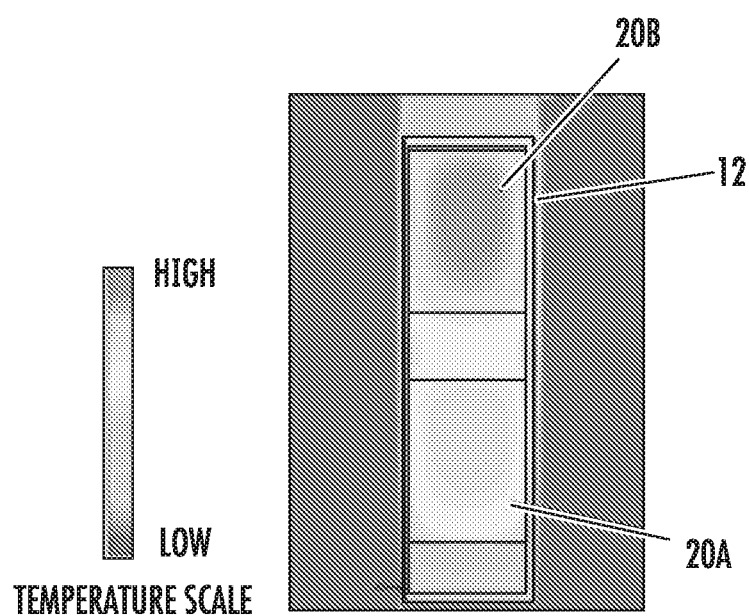
FIG. 3 shows temperature gradients within an electrical system that is cooled by the currently known heatsink of FIG. 1.

Referring now to FIG. 21, temperature gradients within an electrical system 36 that is cooled by the heatsink 22 are shown. The heatsink 22 (not shown in FIG. 21) may be used for natural convection or air may be introduced by surrounding airflow (for example, from a breeze or air movement caused by operation of the electrical system) or intentionally forced by a fan, blower, or the like. In one embodiment, the heatsink 22 is used for natural convection cooling, without the use of a fan or blower. In use, heat from the electrical component(s) of the electrical system 36 is transferred to the heat-dissipating elements 28 through the base plate 24, and may be evenly, or at least substantially evenly transferred, to both the first and second segments 38, 40 of the heat-dissipating elements 28. This heat transfer increases the temperature of fluid (for example, air) within the first and second airflow channels 52, 54. The higher-temperature air within the airflow channels 52, 54 is less dense than air surrounding the heatsink 22, which causes the higher-temperature air to rise within the airflow channels 52, 54 toward the inlet channel 44 and baffle 26. This creates an airflow generally from the first end 30 of the heatsink 22 to the second end 32 of the heatsink 22. If the heatsink 22 is vertically oriented, this is an upward flow. The greater the difference between the temperature of the heat-dissipating elements 28 and the air within the airflow channels 52, 54, the faster the airflow and the greater the cooling capacity of the heatsink 22. In one non-limiting example, the electrical system 36 is a vertical radio unit having at least two heat-generating components 78A and 78B, or at least two portions of a single heat-generating component. In one non-limiting example, the heat-generating component(s) may be antenna board(s). In one embodiment, a first heat-generating component 78A may be located within the electrical system 36 such as the radio unit proximate the first airflow channels 52 and a second heat-generating component 78B may be located within the electrical system 36 such as the radio unit proximate the second airflow channels 54. Routing the first fluid flow out of the heatsink 22 by the baffle 26 prevents the warm air rising within the first airflow channels 52 from entering the second airflow channels 54. The warm air within the first airflow channels 52 may be considered as being "spent," as its temperature is not different enough from the temperature of the first segments 38 of the heat-dissipating elements 28 (from heat transferred through the heat-dissipating elements 28 from the first heat-generating component 78A) to efficiently remove heat from the system. The warm air within the first airflow channels 52 is routed away from the heatsink 22 by the baffle 26 and "fresh" cooler air is drawn into the baffle 26 and enters the second airflow channels 54, thereby preserving the temperature differential that allows the heatsink 22 to more efficiently cool the second heat-generating component 78B of the electrical system 36 such as a radio unit, i.e., electrical system for providing wireless communications. Put another way, the temperature of the first fluid flow (air within the first airflow channels 52) as the first fluid flow exits the heatsink 22 at the baffle 26 from the first airflow channels 52 may be greater than the temperature of the second fluid flow (air within the second airflow channels 54) as the second fluid flow enters the heatsink 22 at the baffle 26 and into the second airflow channels 54. Thus, the baffle 26 not only allows for the introduction of cooler air, but its inclusion in the heatsink 22 allows for shorter heat-dissipating element length by dividing each heat-dissipating element 28 into a first segment 38 and a second segment 40. Further, the baffle 26, and the heatsink 22 as a whole, are configured such that, in one example, the temperature differential between a first heat-generating component proximate the first segment 38 and a second heat-generating component 78B proximate the second segment 40 is below a predefined amount, i.e., may differ in temperature by at most a predetermined amount. For example, FIG. 21 shows that both heat-generating components 78A, 78B have similar temperatures, or at least temperatures that differ by at most a predetermined amount (compare to FIG. 3, wherein the temperatures of the heat-generating components 20A, 20B are significantly different, or at least differ by more than a predetermined amount). This helps keep both heat-generating components 78A, 78B from overheating or reaching a predetermined temperature at which at least one property of the wireless communication system such as at least one beamforming characteristic of the heat-generating component(s) may become altered, which may cause communication noise, reduce system throughput, reduce communication efficiency, etc.

Figure 22:
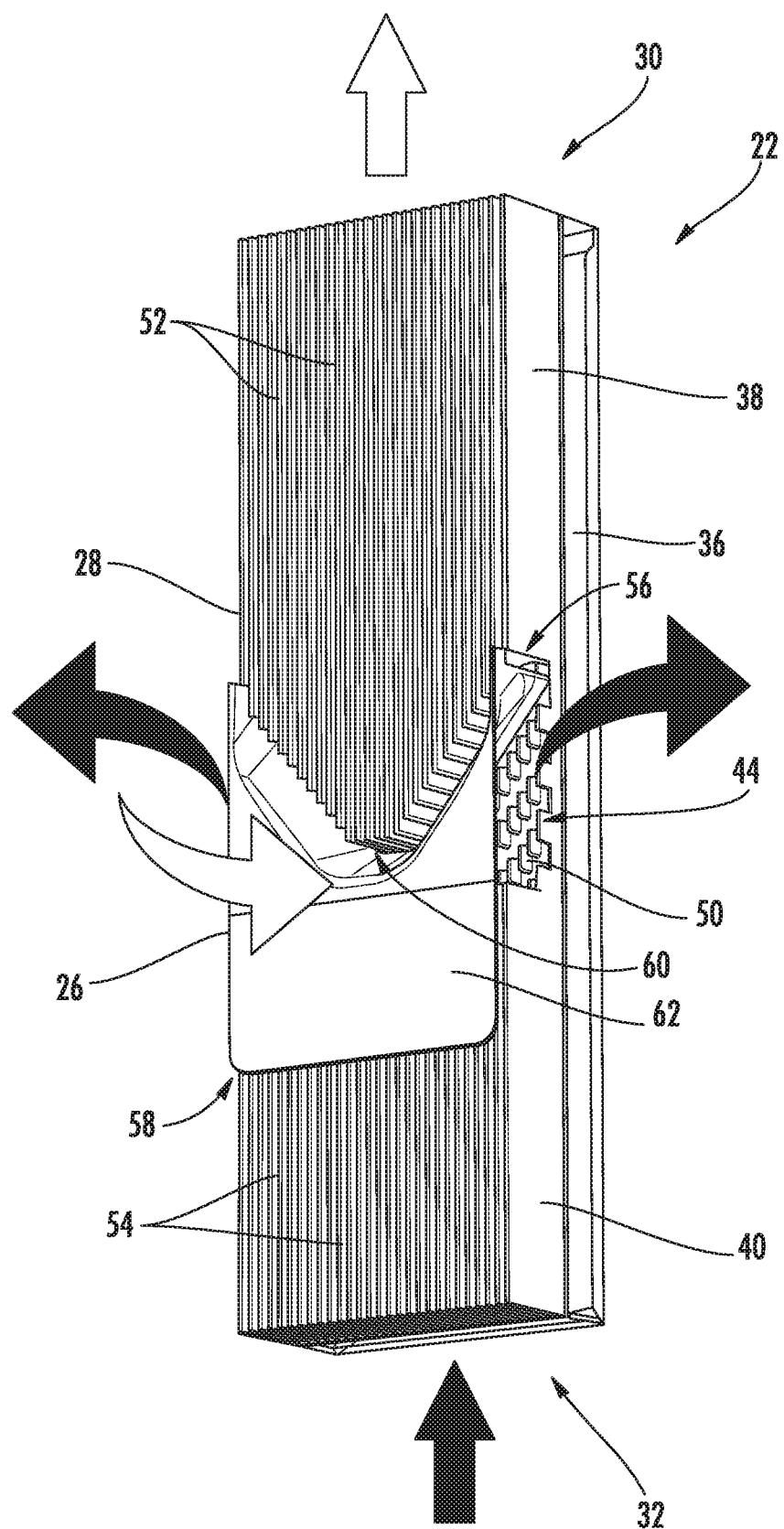
FIG. 22 shows a perspective view of a heatsink in an alternate position and airflow therethrough in accordance with the principles of the disclosure.

Referring now to FIG. 22, a heatsink in an alternate position and airflow therethrough are shown. For purposes of illustration, airflow through the heatsink 22 has been shown in preceding figures and described for cases in which the heatsink 22 is in a vertical position, with a first fluid flow passing from the first or lower airflow channels 52 to the scoop 60 of the baffle 26 and then away from the heatsink 22 and a second fluid flow entering through the inlets 50 into the inlet channel 44 and then into the second or upper airflow channels 54 (for example, in FIGS. 13-20). However, it will be understood that the baffle 26 will simultaneously direct a first fluid flow in a first direction and a second fluid flow in a second direction when the heatsink 22 is in other orientations and/or mounting positions as well. For example, FIG. 22 shows a heatsink 22 that is mounted in a vertical position and having an orientation that is opposite that shown in, for example, FIGS. 13-20.

When the heatsink 22 is in the orientation shown in FIG. 22, the first end 30 and the first segments 38 of the heat-dissipating elements 28 are in an upper position and the second end 32 and the second segments 40 of the heat-dissipating elements 28 are in a lower position. In this orientation, a first fluid flow, depicted by the larger black arrows in FIG. 22, enters the second airflow channels 54 between the second segments 40, enters the inlet channel 44 (which, in this case, may be referred to as an outlet channel 44), and then exits the heatsink 22 through the inlets 50 (which, in this case, may be referred to as outlets 50). A second fluid flow, depicted by the larger white arrows, enters the baffle 26 through the scoop 60, then passes into the first airflow channels 52 between the first segments 38, then exits the heatsink 22 (for example, at least some portion of the second fluid flow exits the first airflow channels 52 at or proximate the first end 30 of the heatsink 22). Thus, the heatsink 22 provides the same cooling efficiency regardless of the orientation of the heatsink 22.

Figure 23:
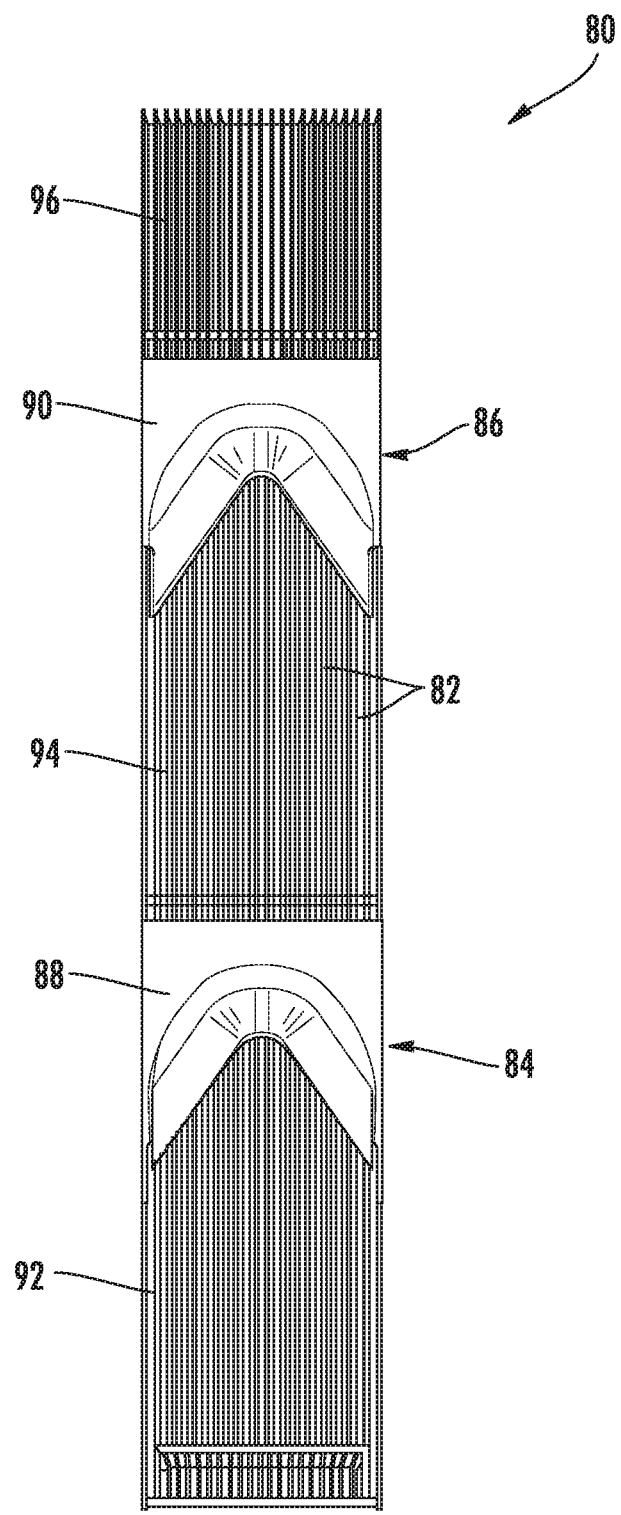
FIG. 23 shows a rear view of another exemplary heatsink for convection cooling having various heat-dissipating elements and baffles in accordance with the principles of the disclosure.

Referring now to FIG. 23, an additional embodiment of a heatsink 80 for convection cooling is shown. For some electrical systems, a longer heatsink may be required. In this case, the heatsink may include more than one baffle to not only reduce the required length of the heat-dissipating elements (for example, fins), but to also vent warm air and draw in cooler air at more than one location. This maintains airflow through the heatsink, thereby maintaining the heat-dissipating elements at a lower temperature. In these embodiments, the heatsink includes more than one baffle and each heat-dissipating element also includes at least one additional segment. Although reference numbers are used for the heatsink 80 shown in FIG. 23 (and FIG. 24) are different than those used for the heatsink 22 of FIGS. 4-20, it will be understood that the principles of operation of the heatsinks 22, 80 are the same. Further, it will be understood that the heatsink may include any number of baffles and heat-dissipating element segments to achieve the desired heatsink length while preserving or increasing cooling efficiency.

Continuing to refer to FIG. 23, the heatsink 80 generally includes a base plate (not shown), a plurality of heat-dissipating elements 82 defining a first inlet channel 84 and a second inlet channel 86, a first baffle 88 at least partially within the first inlet channel 84, and a second baffle 90 at least partially within the second inlet channel 86. In one embodiment, the plurality of heat-dissipating elements 28 is comprised of a plurality of fins. The baffles 88, 90 are as discussed above (for example, in FIG. 9) and each is configured to simultaneously direct a first fluid flow in a first direction (and away from the heatsink 80) and a second fluid flow into the heatsink 80 and in a second direction.

Figure 24:
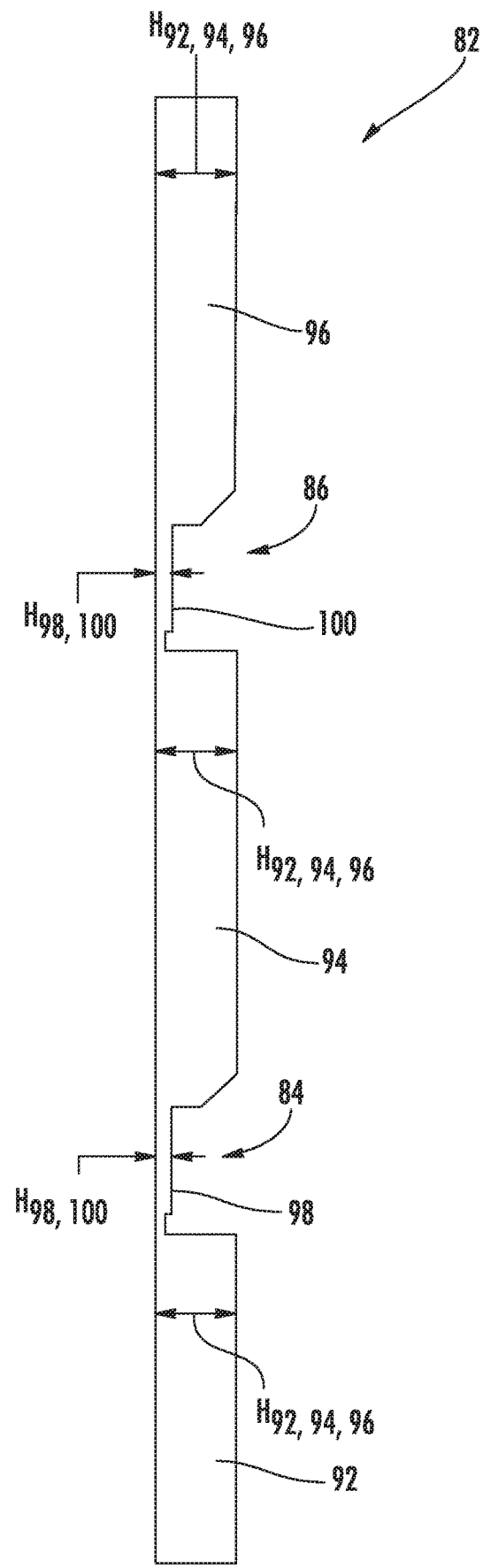
FIG. 24 shows a side view of a heat-dissipating element of the heatsink of FIG. 23 in accordance with the principles of the disclosure.

Referring now to FIG. 24, a heat-dissipating element 82 of the heatsink 80 is shown in greater detail. In one embodiment, each heat-dissipating element 82 is a fin that includes a first segment 92, a second segment 94, and a third segment 96 (also shown in FIG. 23), all having the same, or substantially the same, maximum height $H_{92,94,96}$. Each heat-dissipating element 82 also includes a fourth segment 98 between the first and second segments 92, 94 and a fifth segment 100 between the second and third segments 94, 96. Each of the fourth and fifth segments 98, 100 has a maximum height $H_{98,100}$ that is less than the maximum height $H_{92,94,96}$ of the first, second, and third segments 92, 94, 96. However, it will be understood that the segments may have any suitable height, size, shape, and/or configuration other than those shown. As in the heatsink 22 discussed above, the fourth segment 98 defines at least a portion of the first inlet channel 84 and the fifth segment 100 defines at least a portion of the second inlet channel 86. During operation, warm air from airflow channels between the first segments 92 of the heat-dissipating elements 82 is directed away from the heatsink 80 and cooler air is drawn into airflow channels between the second segments 94 by the first baffle 88 within the first inlet channel 84, and warm air from the airflow channels between the second segments 94 of the heat-dissipating elements 82 is directed away from the heatsink 80 and cooler air is drawn into the airflow channels between the third segments 96 of the heat-dissipating elements 82 by the second baffle 90 within the second inlet channel 86.

It will be appreciated by persons skilled in the art that the present embodiments are not limited to what has been particularly shown and described herein above. In addition, unless mention was made above to the contrary, it should be noted that all of the accompanying drawings are not to scale. A variety of modifications and variations are possible in light of the above teachings.

What is claimed is:

1. A heatsink comprising:
   a first set of heat-dissipating elements defining a first set of channels;
   a second set of heat-dissipating elements defining a second set of channels;
   a first inlet channel configured to allow a first fluid flow to the first set of channels, the first inlet channel extending across the first set of channels;
   a second inlet channel at least partially defined by the second set of heat-dissipating elements, the second inlet channel extending across the second set of channels;
   a first baffle at least partially within the first inlet channel, the first baffle directing a second fluid flow from the second set of channels while preventing fluid flow between the first set of channels and the second set of channels; and
   a second baffle at least partially within the second inlet channel, the second baffle configured to direct the second fluid flow from the second set of channels and to direct a third fluid flow into a third set of channels.

2. The heatsink of claim 1, wherein each of the first and second set of heat-dissipating elements includes:
   a first segment;
   a second segment, the first segment and the second segment each having a same first maximum height; and
   a third segment between the first segment and the second segment, the third segment having a second maximum height that is different than the first maximum height.

3. The heatsink of claim 2, wherein the first inlet channel is at least partially defined by the third segment of each of the first set of heat-dissipating elements.

4. The heatsink of claim 2, wherein the first and second sets of heat-dissipating elements are comprised of a plurality of fins including a first outermost fin and a second outermost fin, the first inlet channel having:
   a first inlet at least partially defined by a portion of the first segment of the first outermost fin, a portion of the second segment of the first outermost fin, the third segment of the first outermost fin, and a first portion of the first baffle; and
   a second inlet at least partially defined by a portion of the first segment of the second outermost fin, a portion of the second segment of the second outermost fin, the third segment of the second outermost fin, and a second portion of the second baffle.

5. The heatsink of claim 2, wherein:
   the first set of channels includes a plurality of first channels between the first segments of the first set of heat-dissipating elements; and
   the second set of channels includes a plurality of second channels between the second set of the heat-dissipating elements.

6. The heatsink of claim 5, wherein the first baffle directs the first fluid flow from the first set of channels and away from the heatsink and directs the second fluid flow into the second inlet channel and then from the second inlet channel into the second set of channels.

7. The heatsink of claim 5, wherein the first inlet channel is between the first set of channels and the second set of channels.

8. The heatsink of claim 2, wherein the first baffle includes:
   a first portion;
   a second portion opposite the first portion; and
   a scoop extending between the first portion and the second portion.

9. The heatsink of claim 8, wherein the second portion is at least substantially planar and lies in a first plane.

10. The heatsink of claim 8, wherein at least a portion of the first portion lies in a second plane that is different than the first plane.

11. The heatsink of claim 10, wherein the scoop extends at an angle from the second portion to the portion of the first portion that lies in the second plane.

12. The heatsink of claim 8, wherein the scoop includes a first surface and a second surface opposite the first surface, the first inlet channel being at least partially defined by the second surface.

13. The heatsink of claim 8, wherein each of the first and second set of heat-dissipating elements has a free edge, the second portion having a plurality of projections, each of the plurality of projections being in contact with a free edge of a corresponding one of the first and second set of heat-dissipating elements.

14. The heatsink of claim 13, wherein the plurality of projections are configured to position the second portion a distance from the free edges of the first and second set of heat-dissipating elements.

15. The heatsink of claim 1, wherein the first fluid flow includes air having a first temperature and the second fluid flow includes air having a second temperature that is less than the first temperature.

\* \* \* \* \*